(12) United States Patent
Teeters et al.

(10) Patent No.: US 9,293,759 B2
(45) Date of Patent: Mar. 22, 2016

(54) NANOSCALE THREE-DIMENSIONAL BATTERY ARCHITECTURE

(71) Applicant: The University of Tulsa, Tulsa, OK (US)

(72) Inventors: Dale Teeters, Sand Springs, AR (US); Paige Johnson, Collinsville, OK (US)

(73) Assignee: The University of Tulsa, Tulsa, OK (US)

( * ) Notice: Subject to any disclaimer, the term of this patent is extended or adjusted under 35 U.S.C. 154(b) by 177 days.

(21) Appl. No.: 14/071,030

(22) Filed: Nov. 4, 2013

(65) Prior Publication Data

US 2014/0106232 A1    Apr. 17, 2014

Related U.S. Application Data

(60) Division of application No. 12/695,835, filed on Jan. 28, 2010, now Pat. No. 8,574,744, which is a continuation-in-part of application No. 11/383,146, filed on May 12, 2006, now Pat. No. 7,736,724.

(60) Provisional application No. 61/148,671, filed on Jan. 30, 2009, provisional application No. 60/681,222, filed on May 13, 2005.

(51) Int. Cl.
*H01M 6/42* (2006.01)
*H01M 4/00* (2006.01)
*H01L 51/44* (2006.01)
(Continued)

(52) U.S. Cl.
CPC .............. *H01M 4/00* (2013.01); *H01L 51/441* (2013.01); *H01M 6/40* (2013.01); *H01M 10/0436* (2013.01); *H01M 10/052* (2013.01); *H01M 10/058* (2013.01); *H01M 10/0472* (2013.01); *H01M 2010/0495* (2013.01);
(Continued)

(58) Field of Classification Search
CPC ....... H01M 4/00; H01M 10/052; H01M 6/40; H01M 10/058; H01M 10/0436; H01M 10/0472; H01L 51/441; Y10T 29/49108; Y10S 977/743; Y02E 10/549; Y02E 60/122
USPC ............................... 429/232, 623.1; 29/623.1
See application file for complete search history.

(56) References Cited

U.S. PATENT DOCUMENTS 6,042,959 A     3/2000  Debe et al.
6,197,450 B1 *  3/2001  Nathan et al. ................. 429/236
(Continued)

OTHER PUBLICATIONS

H. Masuda, K. Nishio and N. Baba, Thin Solids Films, 223, 1, (1993), "Preparation of Microporous Metal Membranes by Two-Step Replication of the Microstructure of Anodic Alumina".
(Continued)

*Primary Examiner* — Gary Harris
(74) *Attorney, Agent, or Firm* — Head, Johnson & Kachigian, P.C.

(57) ABSTRACT

A three-dimensional nanobattery formed by individually wiring nanostructured electrodes and combining them with an electrolyte. Short, capped nanotubes termed 'nanobaskets' are formed by sputtering coating onto nanoporous templates. Metallic nanowires are grown by electrochemical deposition from the nanobaskets and through the template, making electrical contact with each nanobasket electrode. The same procedure can be used to fabricate both a battery anode and a battery cathode. A thin layer of electrolyte is placed between the two nanobasket electrodes, and electrical contact is made through the nanowires.

35 Claims, 18 Drawing Sheets

(51) Int. Cl.
H01M 10/04 (2006.01)
H01M 10/052 (2010.01)
H01M 10/058 (2010.01)
H01M 6/40 (2006.01)

(52) U.S. Cl.
CPC .............. Y02E 10/549 (2013.01); Y02E 60/122 (2013.01); Y10S 977/743 (2013.01); Y10T 29/49108 (2015.01)

(56) References Cited

U.S. PATENT DOCUMENTS

| | | | |
|---|---|---|---|
| 6,387,560 B1 | 5/2002 | Yadav et al. | |
| 6,586,133 B1* | 7/2003 | Teeters et al. | 429/152 |
| 6,940,086 B2 | 9/2005 | Gole et al. | |
| 7,736,724 B1 | 6/2010 | Johnson et al. | |
| 2002/0009632 A1 | 1/2002 | Kim et al. | |
| 2004/0031519 A1 | 2/2004 | Andriessen | |

OTHER PUBLICATIONS

H. Masuda and K. Fukuda, Science, 268, 1466 (1995), "Ordered Metal Nanohole Arrays Made by a Two-Step Replication of Honeycomb Structures of Anodic Alumina".

A.-P. Li, F. Muller, A. Birner, K. Neilsch, and U Gosele, Adv. Mater. 11, 483 (1999), "Fabrication and Microstructuring of Hexagonally Ordered Two-Dimensional Nanopore Arrays in Anodic Alumina".

I. Mikulska, S. Juodkazis, R. Tomasiunas, and J. G. Dumas, Adv. Mater. 13, 1574 (2001), "Aluminum Oxide Photonic Crystals Grown by a New Hybrid Method".

K. H. A. Lau, L.-S. Tan, K. Tanada, M. S. Sander, and W. Knoll, "Highly Sensitive Detection of Processes Occurring Inside Nanoporous Anodic Alumina Templates: A Waveguide Optical Study," Journal of Physical Chemistry, 108, 10812 (2004).

Seshumani Vorrey and Dale Teeters, "Study of the Ion Conduction of Polymer Electrolytes Confined in Micro and Nanopores," Electrochimica Acta, 48, 2137 (2003).

B.J. Neudecker, N.J. Dudney, and J.B. Bates, "Lithium-Free Thin-Film Battery with In Situ Plated Li Anode," Journal of the Electrochemical Society, 147 517 (2000).

Y. Wang, et. al., Solid-State Electronics, 48 (2004) 627-632.

P.Olivi, et al., J. Electrochem. Soc. L81 (1993) 140.

Z. Fang, et. al., Materials Letters, 57 (2003) 4187-4190.

Sun, L., Berndt, C. C., Gross, K. A. and Kucuk, A. (2001), Material fundamentals and clinical performance of plasma-sprayed hydroxyapatite coatings: A review. J. Biomed. Mater. Res., 58: 570-592.

P.X. Ma, et. al. Department of Biologic and Materials Sciences, University of Michigan, Ann Arbor, MI, USA.

Abstracts of Papers, 222nd ACS National Meeting, Chicago, IL, United States, Aug. 26-30, 2001.

Park,Y.J., Park, K.S., Kim, J.G., Kim, M.K., Kim, H.G., Chung, H.T., J. Power Sources (2000) 88 (2), 250 (Month Unknown); "Characterization of Tin Oxide/LiMn2O4 Thin-Film Cell".

Park, Y.J., Kim, J.G., Kim, M.K., Kim, H.G., Chung, H.T., Park, Y., J. Power, Sources (2000) 87 (1-2), 69 (Month Unknown); "Electrochemical Properties of LiMn2O4 Thin Films: Suggestion of Factors for Excellent Rechargeability".

Levasseur, A., Vinatier, P., Gonbeau, D., Bull. Mater. Sci. (1999) 22 (3), 607. (May), "X-ray Photoelectron Spectroscopy: A Powerful Tool For a Better Characterization of Thin Film Materials".

Han, K.S., Tsurimoto, M., Yoshimura, M., Solid State Ionics (1999) 121 (1-4), 229. (Month Unknown); "Fabrication Temperature and Applied Current Density Effects on the Direct Fabrication of Lithium Nickel Oxide Thin-Film Electrodes in LiOH Solution by the Electrochemical-Hydrothermal Method".

Park, Y., Kim, J.G., Kim, M.K., Chung, H.T., Um, W.S., Kim, M.H., Kim, H.G., J. Power Sources (1998) 76 (1), 41. (Month Unknown), "Fabrication of LiMn2O4 Thin Films by Sol-Gel Method for Cathode Materials of Microbattery".

Lee, S.J., Lee, J.K., Kim, D.W., Baik, H.K., Lee, S.M., Journal of the Electrochemical Society (1996) 143 (11) L268-L270. (Nov.); "Fabrication of Thin Film LiCo0.5Ni0.5O2 Cathode for Li Rechargeable Microbattery".

Jones, S.D., Akridge, J.R., Solid State Ionics (1996) 86-8 Part 2 1291-1294. (Month Unknown); "A Microfabricated Solid-State Secondary Li Battery".

Kinoshita, K., Song, X., Kim, J., Inaba, M., Kim, J., Journal of Power Sources (1999) 82 170-175. (Month Unknown); "Development of a Carbon-Based Lithium Microbattery".

Binhar, H., Zuniga, B., and Teeters, D. "Lithium Polymer Battery Systems Using Poly(Chloroacetylene) Electrodes," presented at the 215th National Meeting of the American Chemical Society, Dallas, TX, Mar. 29-Apr. 2, 1998.

Nagatomo, T., Kakehata, H., Ichikawa, C., and Omoto, O., J. Electrochem. Soc., (1985) 132, 1380 (Jun.); "Large-Scale Polyacetylene Batteries".

Nagatomo, T., Kakehata, H., Ichikawa, C., and Omoto, O., Synth. Met., (1987) 18, 649, (Month Unknown); "Polyacetylene Batteries—Scaling Up and Problems".

Korzhova, N., Fisher, S.L., LeGranvalet-Mancini, M., Teeters, D. "Ionic Conduction in Polymer Electrolyte/Microporous Membrane Composites," presented at the Symposium on Polymers for Batteries and Fuel Cells, the 217th National Meeting of the American Chemical Society, Anah.

Alivisatos, A. P., J. Phys. Chem. (1996) 100 13226. (Month Unknown); "Perspectives on the Physical Chemistry of Semiconductor Nanocrystals".

Alivisatos, A. P., Science, (1996) 271 933. (Feb.); "Semiconductor Clusters, Nanocrystals, and Quantum Dots".

Leppert, V. J., Mahammuni, S., Kumbhojkar, N. R., Risbud, S. H. Materi Sc. Eng. B, 1998, 52 89. (Month Unknown); "Structural and Optical Characteristics of ZnSe Nanocrystals Synthesized in the Presence of a Polymer Capping Agent".

Bradley, J. S. in Cluster and Colloids from Theory to Applications, Schmid, G., Ed., VCH: Weinheim, 1994, Chapter 6 and reference therein. (Month Not Applicable); "The Chemistry of Transition Metal Colloids".

Yonezawa, T., Toshima, N., J. Chem. Soc., Faraday Trans. (1995) 91, 4111. (Month Unknown).

Toshima, N., Harada, M., Yamazake, Y., Asakura, K., J. Phys. Chem. (1992), 96, 9927. (Month Unknown); "Catalytic Activity and Structural Analysis of Polymer-Protected Au-Pd Bimetallic Clusters Prepared by the Simultaneous Reduction of HAuCl4 and PdCl2".

Esumi, K. Wakabayashi, M., Torigoe, K., Colloids Surf., (1996) 109 55. (Month Unknown); "Preparation of Colloidal Silver-Palladium Alloys by UV-Irradiation in Mixtures of Acetone and 2-Propanol".

Schaefer, D. M., Reifenberger, R., Patil, A., Samelson, L., Appl. Phys. Lett. (1995) 66 1012. (Feb.); "Fabrication of Two-Dimensional Arrays of Nanometer-Size Clusters with the Atomic Force Microscope".

Junno, T., Deppert, K., Montelius, L., Samuelson, L, Appl. Phys. Lett. (1995) 6 3627. (Jun.); "Controlled Manipulation of Nanoparticles with an Atomic Force Microscope".

Sheehan, P. Leiber, C. M., Science (1996) 272, 1158. (May); "Nanotribology and Nanofabrication of MoO3 Structures by Atomic Force Microscopy".

Baur, C., Gazen, B. C., Koel, B. E., Ramachandran, T. R., Requicha, A. A. G., Zini, L., J. Vac. Sci. Tehnol., B (1997) 15, 1577. (Jul./Aug.); "Robotic Nanomanipulation with a Scanning Probe Microscope in a Networked Computing Environment".

Brandow, S. L., Dressick, W. J., Dulcey, C. S., Koloski, T. S., Shirey, L. M., Schmidt, J., Calvert, J. M., J. Vac. Sci. Technol., B (1997) 15, 1818. (Sep./Oct.); "Nanolithography by Displacement of Catalytic Metal Clusters Using an Atomic Force Microscope Tip".

Ramachandran, T. R., Baur, C. Bugacov, A., Madhukar, A., Koel, B. E., Requicha, A. A. G., Gazen, B. C., Nanotechnology, (1998) 9, 237. (Month Unknown); "Direct and Controlled Manipulation of Nanometer-Sized Particles Using the Non-Contact Atomic Force Microscope".

Schindler, W., Hofmann, D., Kirschner, J., J. Appl. Phys. (2000) 87 7007. (May); "Nanoscale Electrodeposition: A New Route to Magnetic Nanostructures?".

(56) References Cited

OTHER PUBLICATIONS

Cepak, V. M., Martin, C. R., Chem. Mater. (1999) 11 1363. (Month Unknown); "Preparation of Polymeric Micro- and Nanostructures Using a Template-Based Deposition Method".

Anantram, M. P., Datta, S., Xue, Y., Phys. Rev. B (2000) 61 14219). (May); "Coupling of Carbon Nanotubes to Metallic Contacts".

Nonobatteries: Decreasing Size Power Sources for Growing Technologies; David A. Lowy and Adrian Patrut; Recent Patents on Nanotechnology 2008, 2, 208-219.

Qui, Limin, Ma, Jiming, et al., "Synthesis and Characterization of mesostructured Tin Oxide with Crystalline Walls", Langmuir, 14(9) 2579-2581 (1998).

Bunshah, Rointan F., "Handbook of Deposition Technologies for Films and Coatings: Science Technology and Applications", 2nd Ed., Noyes Publications, 1994, pp. 249-251.

Elena D. Mishina et al., "Ferroelectric Nanostructures Sputtered on Alumina Membranes", Physica E., 25 (2004) pp. 35-41.

Vovk, A. et al., "Preparation, Structural Characterization, and Dynamic Properties Investigation of Permally Antidot Arrays", J. Appl. Phys., 97, 10J506 (2005).

* cited by examiner

Nanobasket Side
Side A
↓

↑
Side B
Non-coated side of
membrane where
nanowires must protrude
for contact with a current
collector

NANOSCALE THREE-DIMENSIONAL BATTERY ARCHITECTURE

CROSS-REFERENCE TO RELATED APPLICATIONS

This application is a divisional of U.S. patent application Ser. No. 12/695,835, filed Jan. 28, 2010, which claims priority to U.S. Provisional Patent Application Ser. No. 61/148,671, filed Jan. 30, 2009 and is a continuation-in-part of U.S. patent application Ser. No. 11/383,146 filed May 12, 2006, which claims priority to U.S. Provisional Patent Application Ser. No. 60/681,222 filed May 13, 2005, each of which is incorporated herein by reference in its entirety.

STATEMENT REGARDING FEDERALLY SPONSORED RESEARCH OR DEVELOPMENT

This invention was made with U.S. Government support under the Department of Defense, Army Research Office, DEPSCoR Grant No. W911NF-07-1-0398, the National Science Foundation Prime Agreement No. EPS-0447262. The U.S. Government has certain rights in the invention.

NAMES OF THE PARTIES TO A JOINT RESEARCH AGREEMENT

Not Applicable.

REFERENCE TO A SEQUENCE LISTING, A TABLE, OR A COMPUTER PROGRAM LISTING APPENDIX

Not Applicable.

BACKGROUND OF THE INVENTION

1. Field of the Invention

This invention relates generally to nanoscale three-dimensional battery architecture which can accommodate various combinations of new electrode materials, electrolytes and wiring configurations in order to optimize battery performance, and more particularly to a three-dimensional nano-battery system having individually wired nanostructured anode and cathode electrodes with conductive nanowires and a thin, intermediate layer of an electrolyte.

2. Description of the Related Art

The potential of nanotechnology to provide new technological breakthroughs is the object of much current attention. Nanostructured materials have the potential for enhanced properties and efficiency improvements in virtually every area of science and technology through enhanced surface areas and quantum-scale reactions. This disclosure deals with the formation of novel nanoscale structures that have numerous potentially important applications.

An example of an application for nanotube structures is found in Assignee's U.S. Pat. No. 6,586,133 for "Nano-Battery Systems" issued Jul. 1, 2003. The patented disclosure is directed to nano-batteries and micro-batteries as well as their manufacture and use. Porous substrate technology is utilized wherein the substrate has a plurality of holes or pores that range in diameter between ten (10) micrometers to one (1) nanometer (nm).

Nanoscale or microscale deposition of particles by a sputtering process is also known. The process of sputtering may be defined as the ejection of particles from a condensed-matter target due to the impingement of energetic projectile particles. Operatively, the source of coating material, referred to as the target, is mounted opposite to the sample, in this case a porous substrate in a vacuum chamber. The most common method of generating ion bombardment is to backfill the evacuated chamber with a continual flow of gas and establish a glow discharge, indicating that ionization is occurring. A negative potential applied to the target causes it to be bombarded with positive-ions while the substrate is kept grounded. Impingement of the positive-ion projectile results in ejection of target atoms or molecules and their deposition on the substrate.

One of the most useful characteristics of the sputtering process is its universality: virtually any material is a coating candidate. Sputtering systems assume an almost unlimited variety of configurations, depending on the desired application. DC discharge methods are often used for sputtering metals, while an RF potential is used for less conductive materials. Ion-beam sources can also be used. Targets may be elements, alloys, or compounds, in either doped or undoped forms, and can be employed simultaneously or sequentially. The substrate may be electrically biased so that it too undergoes ion bombardment. A reactive gas may be used to introduce one of the coating constituents into the chamber, i.e. oxygen to combine with sputtered tin to form tin oxide (reactive sputtering).

A nanostructure fabricated by RF sputtering of barium strontium titanate (BST) on porous alumina substrates suggests that the sputtered material does not penetrate into pores, but rather preferentially gathers along the continuous circular edge of pore openings. These types of sputtered metal structure or "antidots" are not partially or complete capped, are not layered, are formed only from metals, and are not used to assemble any type device.

Nanotubes and other nanostructures may be formed as large arrays, and in this form are often referred to as nanoporous or mesoporous structures. "Meso-porous" tin oxide structures have been created using surfactant templating techniques. The resultant material, however, consists of material containing irregular nanopores averaging about two (2) nm in size, without long-range order. These nanoporous or mesoporus structures cannot be formed in large arrays of tunable pore sizes, which develop wall height as well as porosity, and also cannot be partially or completely capped to form a nanobasket structure.

Accordingly, it is desirable to produce a nanotube structure wherein at least one end of a nanotube is partially or completely closed or covered over so that the nanotube forms a nanobasket.

It is further desirable to use sputter deposition techniques to create partially or completely capped and/or layered nanotube structure, which opens a wide range of potential applications.

It is still further desirable to utilize a substructure of very small nanoparticles, i.e., the walls and caps of the basket are themselves composed of nanoparticles ten (10) nm and less in size. Numerous scientific studies attest to the importance of nanoparticulate grain size in performance characteristics of electronic, optical, and catalytic devices.

It is yet further desirable to form a large array of nanobaskets as a nanoporous architecture, such as for use in battery systems.

The assembly of individual nanostructured components into a three-dimensional battery system has been proposed as the means to promote ion diffusion in electrode materials by substantially increasing the effective electrode surface area to improve energy per unit area characteristics and promote a high rate charge/discharge capacity. Such features should enhance general battery performance, but they are of particular importance for thin film batteries and nanobatteries able to power proposed micro and nano electromechanical systems (MEMS and NEMS). Recent work on three-dimensional architectures for improved performance includes rods or "posts" connected to a substrate, graphite meshes and films of cathode, electrolyte and anode materials lining microchannels in an inert substrate.

The nanoscale three-dimensional battery architecture disclosed herein represents a novel approach from other proposed solutions by focusing on a negative space (the hollow portion within the nanobaskets) rather than on a positive-space structure such as a rod, post, mesh or film. While multiple three-dimensional battery architectures have been proposed, no prior configurations are based upon the individual wiring of hollow nanobaskets nor has a working three-dimensional nanobattery been claimed.

It is therefore desirable to provide a three-dimensional nanobattery formed by individually wiring nanobasket structured electrodes and combining them with an electrolyte. Short, capped nanotubes, i.e., nanobaskets, may be formed by RF-magnetron sputtering onto nanoporous templates, and metallic nanowires are grown, such as by electrochemical deposition, from the nanobaskets. The same procedure can be used to fabricate both a battery anode and a battery cathode, and a thin layer of electrolyte is placed between the two nanobasket electrodes. The nanobattery circuitry may be completed by contacting the ends of the nanowires opposing the electrolyte with a conductor, such as a metal plate.

It is further desirable to provide a three-dimensional nanobattery architecture that promotes ion diffusion in electrode materials by substantially increasing the effective electrode surface area to improve energy per unit area characteristics and promote a high rate charge/discharge capacity.

It is still further desirable to provide a nanoscale three-dimensional battery architecture for thin film batteries and nanobatteries, which would be able to power proposed micro- and nano-electromechanical systems (MEMS and NEMS), or used in massive arrays in place of conventional batteries.

It is yet further desirable to provide a nanoscale three-dimensional battery architecture based upon individual wiring of hollow nanostructures and that represents a robust nanoarchitecture that accommodates a variety of electrode and electrolyte types.

SUMMARY OF THE INVENTION

In general, in a first aspect, the invention relates to a method of producing a three-dimensional nanobattery by providing a substrate having at least one pore, depositing at least one material along continuous edges of the pore to form a nanobasket, depositing at least one conductive material within the nanobasket and through the substrate to form a nanowire, and providing a layer of electrolyte in electrical contact with the nanobasket. The method may further include the steps of providing a cathode substrate having a plurality of pores, each of the pores having a continuous edge at a surface of the cathode substrate; depositing the at least one material along the continuous edge of each of the pores of the cathode substrate forming a plurality of cathode nanobaskets; depositing the at least one conductive material within the cathode nanobaskets and through the pores of the cathode substrate to form a plurality of nanowires connected to the cathode; providing an anode substrate having a plurality of pores, each of the pores having a continuous edge at a surface of the anode substrate; depositing the at least one material along the continuous edge of each of the pores of the anode substrate forming a plurality of anode nanobaskets; depositing the at least one conductive material within the anode nanobaskets and through the pores of the anode substrate to form a plurality of nanowires connected to the anode; providing the layer of electrolyte intermediate of the cathode nanobaskets and the anode nanobaskets; and making electrical contact with the cathode nanowires and the anode nanowires.

The step of depositing the at least one material along the continuous edges of the pore of the method may be accomplished by sputter-coating, such as direct current sputter-coating, radio frequency sputter-coating, magnetron sputter-coating and reactive sputter-coating, chemical vapor deposition or pulsed laser method. At least one additional material may also be deposited to form a layered nanobasket structure.

In general, in a second aspect, the invention relates to a three-dimensional nanobattery having a nanoporous substrate, a nanobasket, a nanowire and a layer of electrolyte. The nanoporous substrate includes at least one pore, with each the pore having a continuous edge at a surface of the substrate. The nanobasket is fabricated from clusters of material deposited on the continuous edge of the substrate, while the nanowire is fabricated from a conductive material through the nanobasket and the substrate. The layer of electrolyte is in contact with the nanobasket. The substrate may include a plurality of the pores, the nanobasket may include a plurality of cathode nanobaskets and a plurality of anode nanobaskets, and the nanowires may be a plurality of nanowires, with the layer of electrolyte being intermediate of the cathode nanobaskets and the anode nanobaskets.

The substrate of the nanobattery may be a conducting, non-conducting or semi-conducting material, such as at least one of solid oxide, polymeric, ceramic, mineral or metallic materials or a polycarbonate, carbon, silica, silicon or alumina material. The material deposited to form the nanobasket may be a conducting, non-conducting or semi-conducting material. Moreover, the material deposited to form the nanobasket may be an oxide, polymeric, ceramic, mineral or metallic material, such as tin oxide, lithium cobalt oxide, zinc oxide, copper oxide, titanium oxide, titanium dioxide, vanadium pentoxide, magnesium oxide, silicon dioxide, carbon, silicon, nichrome, and hydroxyapatite. The conductive material used to fabricate the nanowires may be any conductive metal, such as copper or any electrically conducting polymer, such as poly(acrylonitrile). Additionally, the nanobattery may include at least one additional material to form a layered cap over the nanobasket.

BRIEF DESCRIPTION OF THE DRAWINGS

FIG. 16(a) shows a nanobasket structure grown on a nanoporous membrane, wherein the dashed line shows the outline of the nanobasket; FIG. 16(b) shows the wired membrane with the nanowires running from the nanobaskets, through the nanoporous membrane so that electrical contact can be made with a current collector; FIG. 16(c) has a higher magnification showing the nanowire extending into the nanobasket and making contact with the nanobasket (dashed line) where intimate contact with the nanobasket electrode is made; and FIG. 16(d) shows the top of the nanobasket structure having a large surface area for electrolyte contact;

Other advantages and features will be apparent from the following description and from the claims.

DETAILED DESCRIPTION OF THE INVENTION

The devices and methods discussed herein are merely illustrative of specific manners in which to make and use this invention and are not to be interpreted as limiting in scope.

While the devices and methods have been described with a certain degree of particularity, it is to be noted that many modifications may be made in the details of the construction and the arrangement of the devices and components without departing from the spirit and scope of this disclosure. It is understood that the devices and methods are not limited to the embodiments set forth herein for purposes of exemplification.

Figure 1:
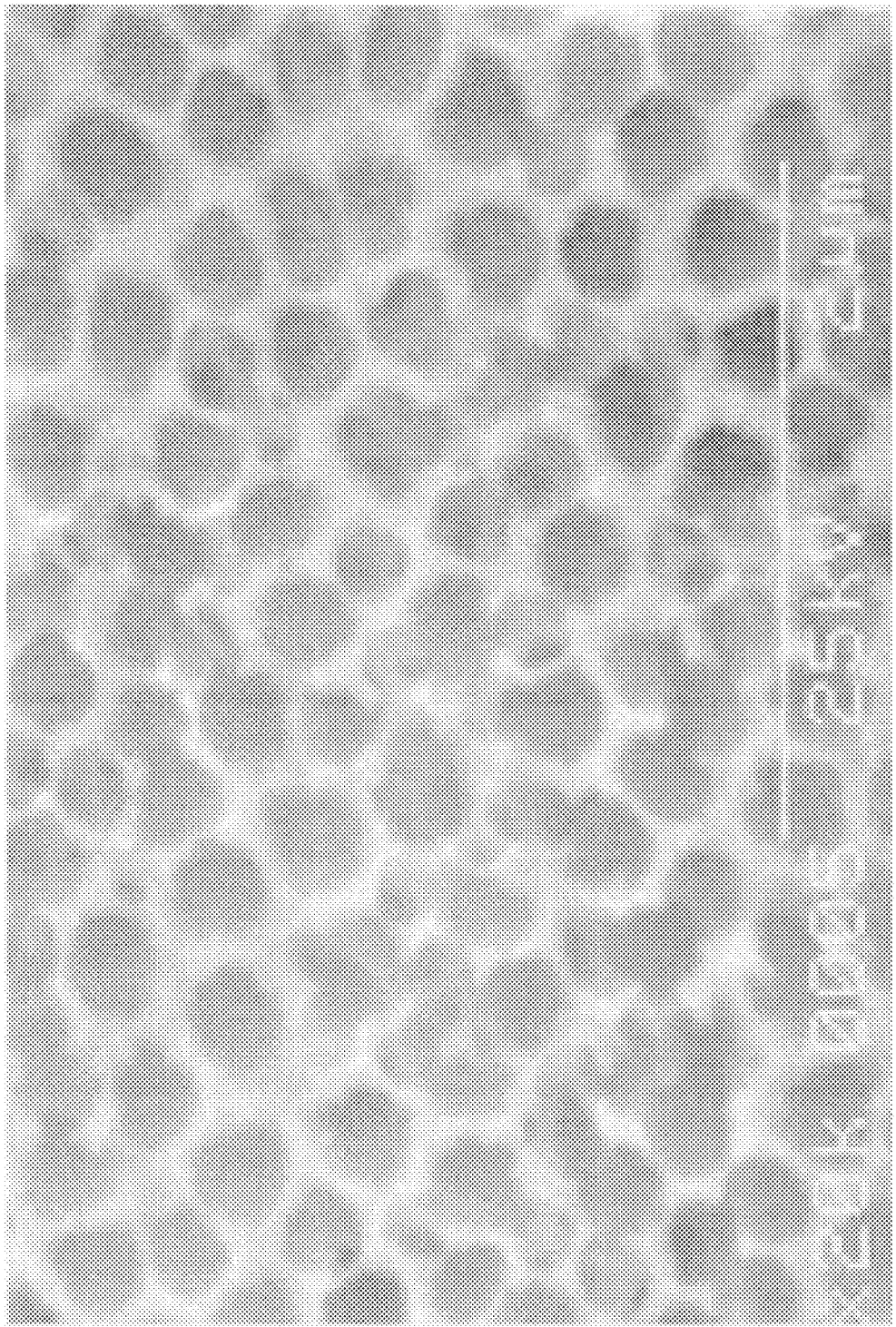
FIG. 1 illustrates an electron microscope photograph of a stage in the process of the fabrication of nanobaskets by sputter deposition on porous substrates disclosed herein.

Referring to the figures of the drawings, wherein like numerals of reference designate like elements throughout the several views, and initially to FIG. 1 illustrating an electron microscope photograph of a stage in the process of the formation of a nanoscale structure that includes capped nanotubes, termed "nanobaskets" by a sputter-coating method on a porous substrate as the template for the structure. The nanoporous substrate could be made from numerous materials whose surface energy values are such that they are conducive to the formation of nanobaskets. In one example, a substrate has a plurality of pores that range between ten (10) micrometers to one (1) nanometer (nm) in diameter. Various substrates could be used, e.g., either polymeric (such as polycarbonate) or ceramic material (such as alumina oxide ($Al_2O_3$)). Nanoporous substrates of silicon or metallic porous structures could also be used. The substrate includes pores that could be created by laser ablation, a chemical etching process, an electrochemical process, track etching, micro or nanolithography, contact lithography, chemical self-assembly or by other methods. The length of the pores in the substrate itself has not been found to be critical to the nanobasket formation, and so could vary over any conceivable length range.

The nanoporous substrate could be made using several techniques. One involves the use of nanoporous anodized aluminum oxide substrates. The process for making these substrates has been described in the literature (H. Masuda, K. Nishio and N. Baba, Thin Solids Films, 223, 1, (1993); H. Masuda and K. Fukuda, Science, 268, 1466 (1995); A.-P. Li, F. Muller, A. Birner, K. Neilsch, and U Gosele, Adv. Mater. 11, 483 (1999); I. Mikulska, S. Juodkazis, R. Tomasiunas, and J. G. Dumas, Adv. Mater. 13, 1574 (2001)) and consists of applying an electrical potential to an aluminum sheet while in an acid solution. Micro and nanolithographic techniques and other techniques such as X-ray-beam, electron-beam and ion-beam lithography could be used. Microcontract printing could also be used to make the nanoporous substrate.

The nanobasket structure can be formed using sputter-coating techniques. This includes DC sputter-coating, RF sputter-coating and RF magnetron sputter-coating. Chemical reactive sputtering could also be used. The structure could also be formed using chemical vapor deposition or pulsed laser methods.

At the surface of the substrate, the pores have a continuous edge, which could be of any relative geometric configuration. As a target material is sputter-coated, nanoscale clusters of the material collect preferentially on the continuous edge of the pores of the underlying substrate. As the process of depositing material continues, it results in the gradual build-up of "walls" that effectively extend the pore structure with the target material to form a nanotube. The pore size of these nanotubes is dependent on the substrate's original pore structure and, therefore, their diameter can be varied by using substrates of varying pore sizes.

As the sputter-coating process is continued, it has been observed that the walls grow thicker as they grow taller so that they will eventually touch, capping over the pore spaces with deposited material to form the base or end of a basket. Depending on the parameters used in the sputter-coating process, such as plasma gas concentration, power, target materials, and underlying substrate, the pores can be made to cap at various lengths or heights from the substrate surface, ranging from tens to hundreds of nanometers. Capped nanoporous structures have hereto before been difficult to synthesize and have different potential application than open tubes.

Figure 2:
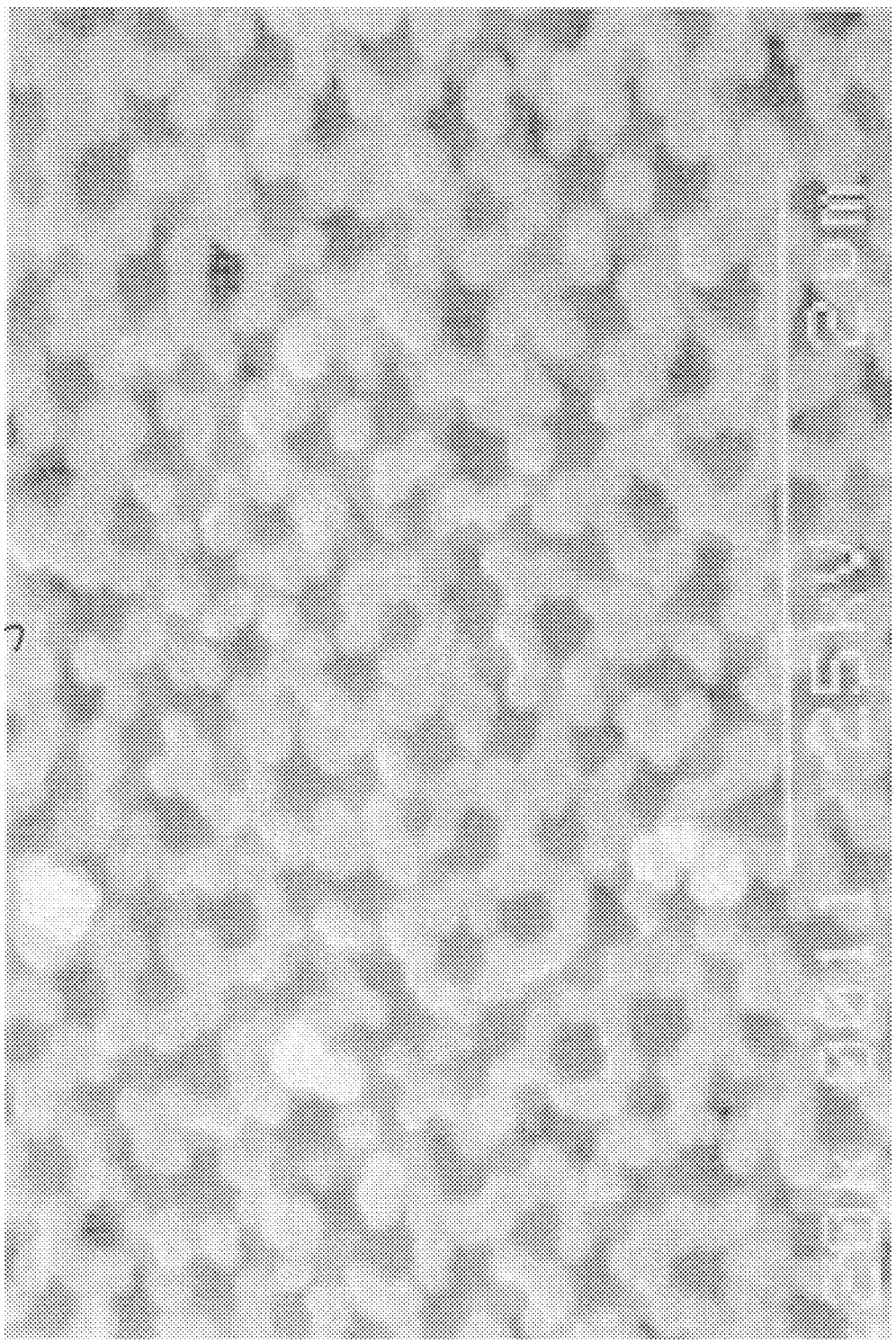
FIG. 2 illustrates a sequential stage in the process subsequent to that shown in FIG. 1.
Figure 3:
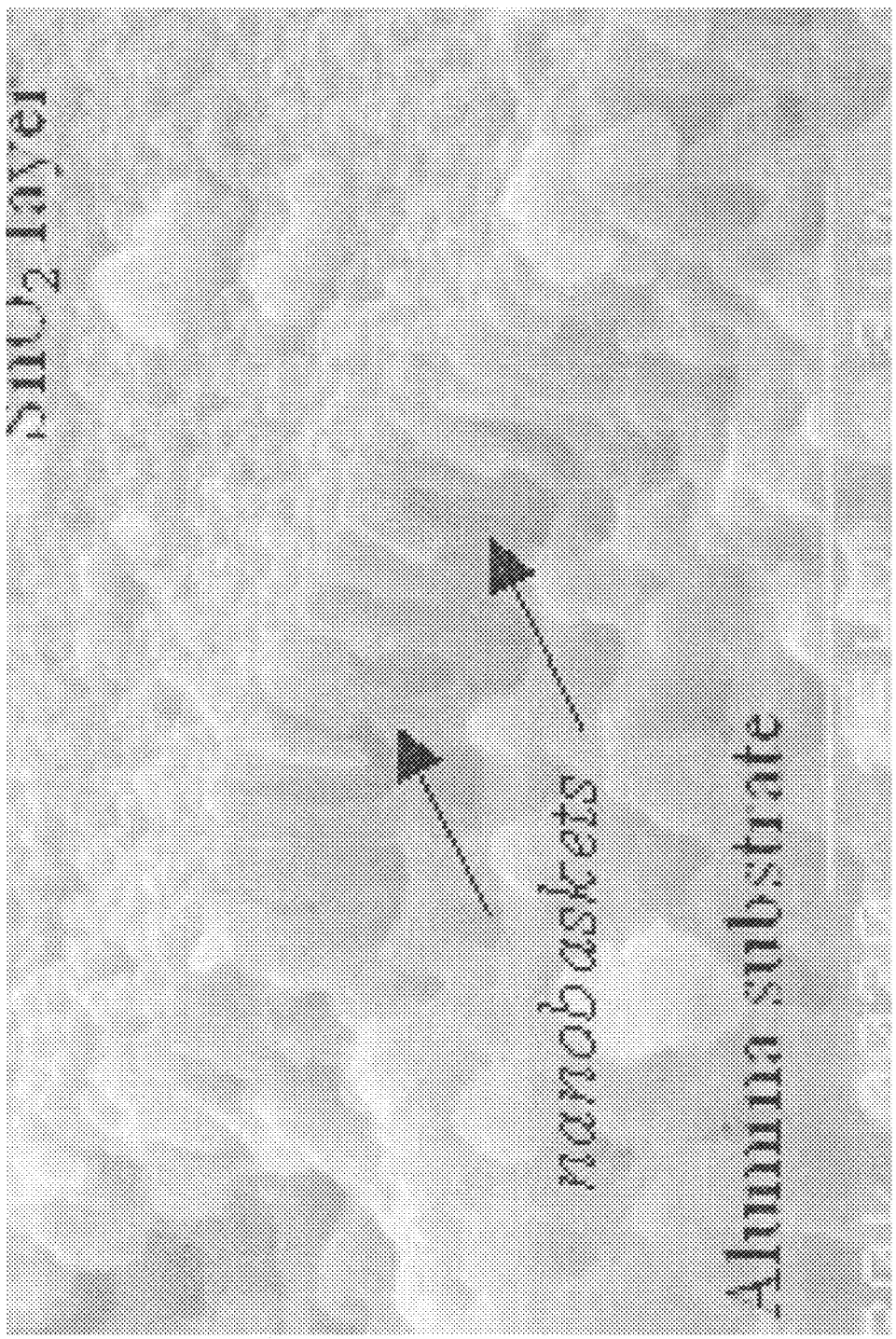
FIG. 3 illustrates a partial, sectional view of an electron microscope photograph of a further subsequent stage of the process.
Figure 8:
FIG. 8 illustrates an electron microscope photograph of a sectional view of a partially capped nanobasket in accordance with an illustrative embodiment of the fabrication of nanobaskets by sputter deposition on porous substrates disclosed herein.
Figure 9:
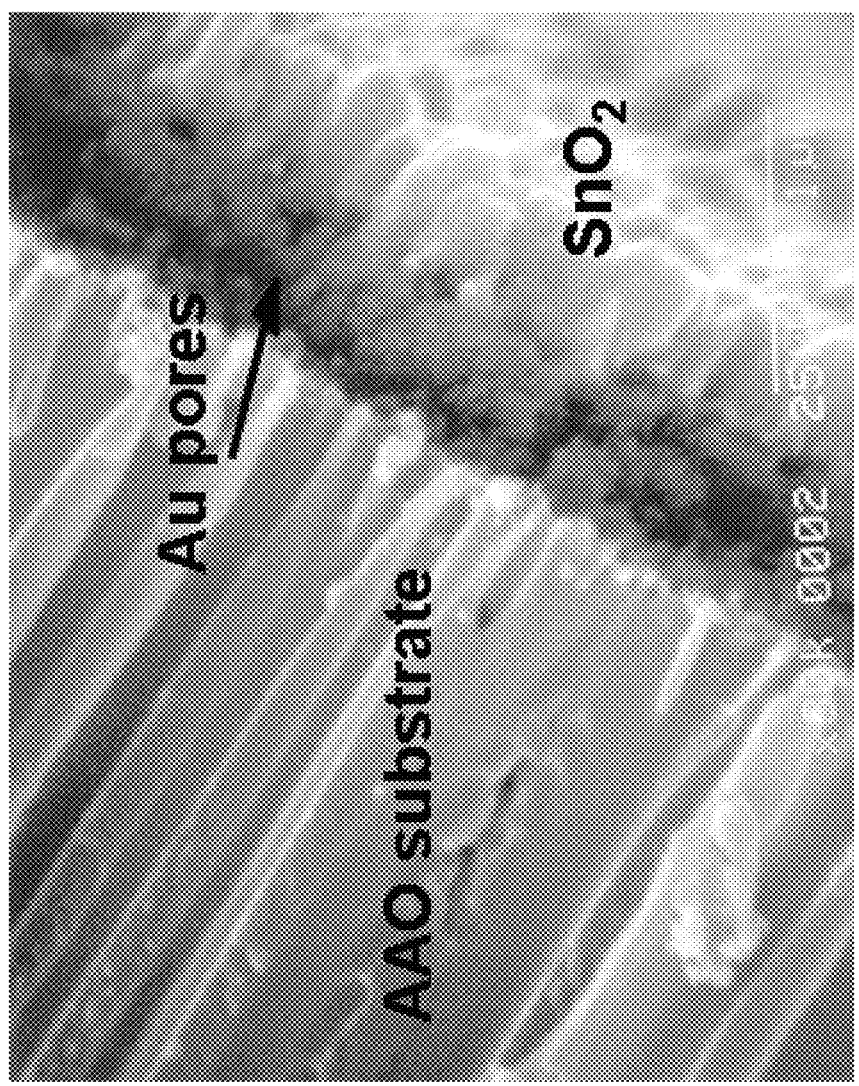
FIG. 9 illustrates an electron microscope photograph of a capped nanobasket utilizing multiple compositions to create a layered structure in accordance with an illustrative embodiment of the fabrication of nanobaskets by sputter deposition on porous substrates disclosed herein.
Figure 14:
FIG. 14 illustrates a transmission electron microscope photo of the grains composing the nanobasket in accordance with an illustrative embodiment of the fabrication of nanobaskets by sputter deposition on porous substrates disclosed herein.
Figure 15:
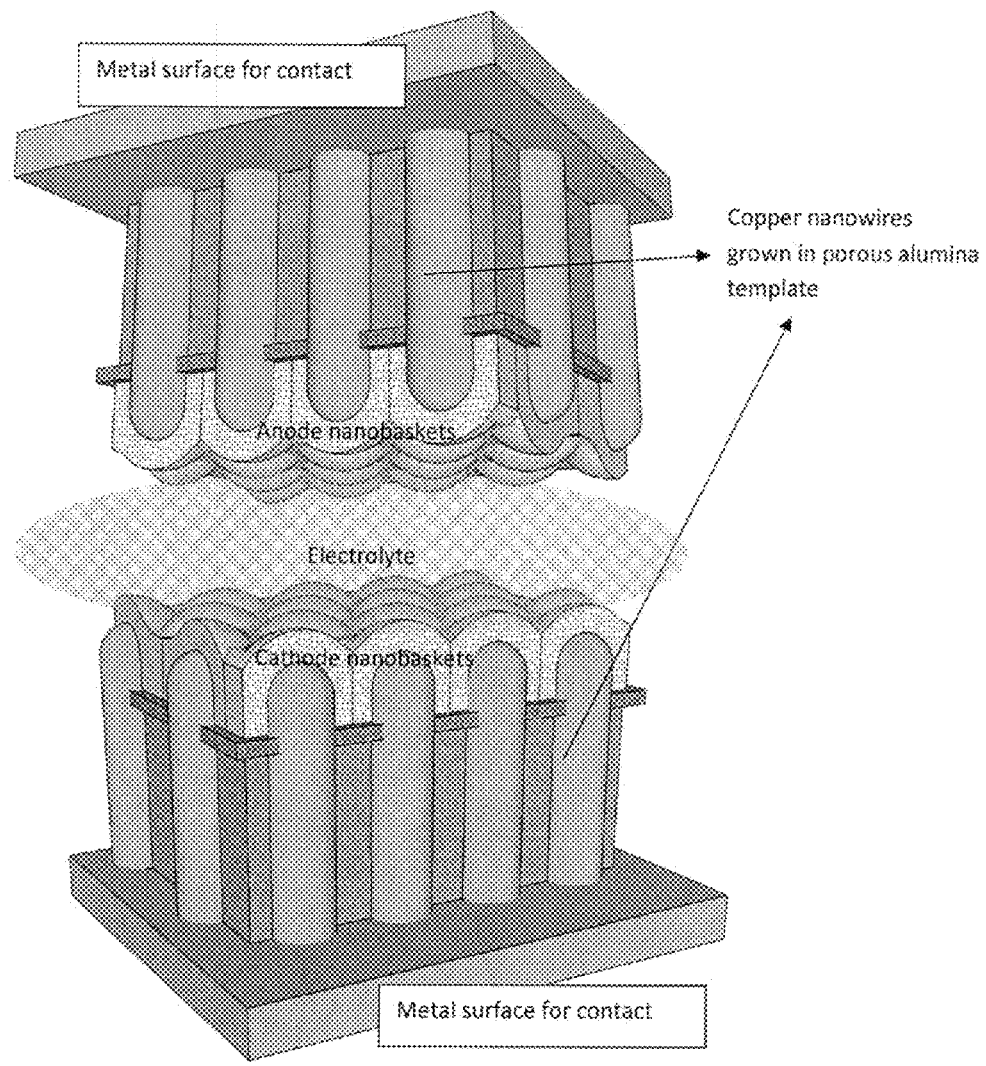
FIG. 15 illustrates a perspective view of a three-dimensional nanobattery in accordance with an illustrative embodiment of the nanoscale three-dimensional battery architecture disclosed herein.

FIG. 1 illustrates an electron microscope photograph of a stage in the process of the fabrication of a nanobasket by sputter deposition on a porous substrate in accordance with an illustrative embodiment of the fabrication of nanobaskets by sputter deposition on porous substrates disclosed herein. FIG. 2 illustrates an electron microscope photograph of approximately 400 nanometers of tin oxide sputtered onto an alumina substrate. It will be observed that the material is beginning to cap or close over. FIG. 3 illustrates an electron microscope photograph of a partial cross-section of the photo shown in FIG. 2. The alumina substrate may be viewed with the tin oxide sputtered thereon to form the nanobaskets. FIG. 8 is an electron microscope photograph that shows that as the structures begin to cap over, very small nanochannels are formed that may also be of technical significance. Such nanochannels have potential applications in the trapping of molecular species, confinement of DNA and RNA, specialized filtrations, and chromatographic analysis. This would be one example of a "partially capped" structure. Partially capped structures are created by stopping the sputtering process before the walls of the nanobasket have grown together to form a continuous cap. FIG. 9 illustrates an electron microscope photograph of a capped nanobasket utilizing multiple compositions to create a layered structure. FIG. 14 shows the nanograins that compose the walls and cap of the nanobasket. The fact that the nanobasket architecture itself contains a substructure of nanograins is expected to further enhance the performance of the nanobaskets.

Initial research indicates that the method is robust and can be generalized to many materials of technological importance. Current research has focused on metallic oxides, such as $SnO_2$, $LiCoO_2$, and $TiO_2$ for which nanobaskets would be of importance in photovoltaic and battery applications. Copper oxide nanobaskets are of importance in catalytic operations. Metal alloys, such as Nichrome, are useful for the manufacture of thermal devices. Even materials such as hydroxyapatite, the mineral closest in composition to bone, are amenable to this technique and have been observed to form nanobaskets. These materials may have important applications as bone mimics and tissue scaffolding.

The fabrication of nanobaskets by sputter deposition on porous substrates disclosed herein also allows the formation of nanobaskets of multiple compositions. The ability to create a layered structure is truly unique and allows for the straightforward and easy assembly of nanodevices using appropriate selections of materials; for example, current collectors, electrodes, and semiconductors or layered semiconductors. A layered nanobasket system may made by sputtering a first material, but stopping the sputtering at some desired point before the walls have grown thick enough to form a cap. A second material can then be sputtered atop the first, continuing to extend the walls of the baskets upward. Sputtering of this second material can continue until capping occurs, or it can also be stopped at a desired point before the walls have grown together, and more layers can be added. Configurations of up to five layers have so far been demonstrated. The number of layers possible is dependent upon the materials and pore sizes used.

The nanobasket structures can be used as sputtered, remaining attached to the substrate, or may be removed from the substrate by appropriate mechanical or chemical methods. The nanobasket structures can further be utilized by functionalization of their surfaces, attachment of additional catalytic materials, or by filling the pore spaces with a desired medium such as an electrolyte. Further, the nanobasket structures can undergo heat-treatment as necessary for a desired application.

The nanobasket structures and/or layers within them may be made from doped elements or compounds; for example, $SnO_2$ doped with Indium. An example of fabrication of a nanobasket from a single deposited material and from multiple compositions to form a layered cap follows:

Example 1 of Single-Component Fabrication Using $SnO_2$

An anodized aluminum oxide (AAO) substrate is placed on the sample stage of an RF-magnetron sputtering system which is fitted with a tin oxide ($SnO_2$) target. A chamber is filled and flushed with argon gas, and sputtering is initiated under system conditions of 0.01 mbar argon pressure and 35 watts forward power. In accordance with the generally recognized principles of sputter depositions, $SnO_2$ is removed from the target and deposited onto the AAO substrate. Film thickness is monitored using a quartz crystal thickness monitor. When the desired thickness is reached, turning off the power halts the sputtering process.

Example 2 of Layered Fabrication Using Gold (Au) and Lithium Carbonate ($LiCoO_2$)

An anodized aluminum oxide (AAO) substrate is placed on the sample stage of an RF-magnetron sputtering system which is fitted with a gold (Au) target. The chamber is filled and flushed with argon, and sputtering is initiated under system conditions of 0.01 mbar argon pressure and 35 watts forward power. In accordance with the generally recognized principles of sputter depositions, gold is removed from the target and deposited onto the AAO substrate. Film thickness is monitored using a quartz crystal thickness monitor. When the desired thickness is reached, sputtering is halted and the chamber is opened. A new target of $LiCoO_2$ is installed. The chamber is again filled and flushed with argon, and sputtering is initiated under system conditions of 0.01 mbar argon pressure and 35 watts forward power. $LiCoO_2$ is removed from the target and deposited onto the gold layer previously deposited on the AAO substrate. Film thickness is monitored using a quartz crystal thickness monitor. When the desired thickness is reached, turning off the power halts the sputtering process.

Figure 4:
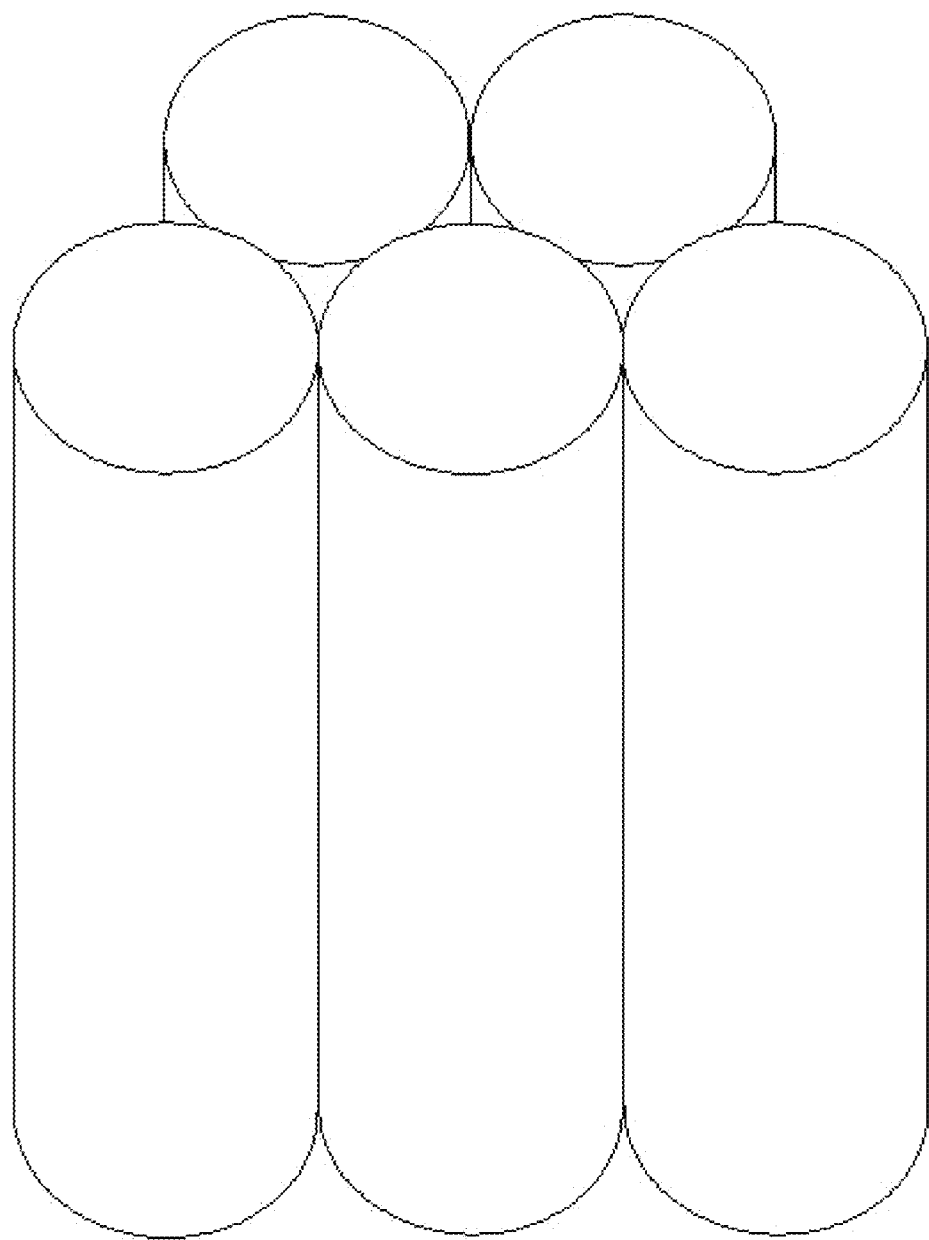
FIG. 4 illustrates a simplified, diagrammatic view an example capped tubes utilizing multiple compositions to create a layered structure in accordance with an illustrative embodiment of the fabrication of nanobaskets by sputter deposition on porous substrates disclosed herein.
Figure 5:
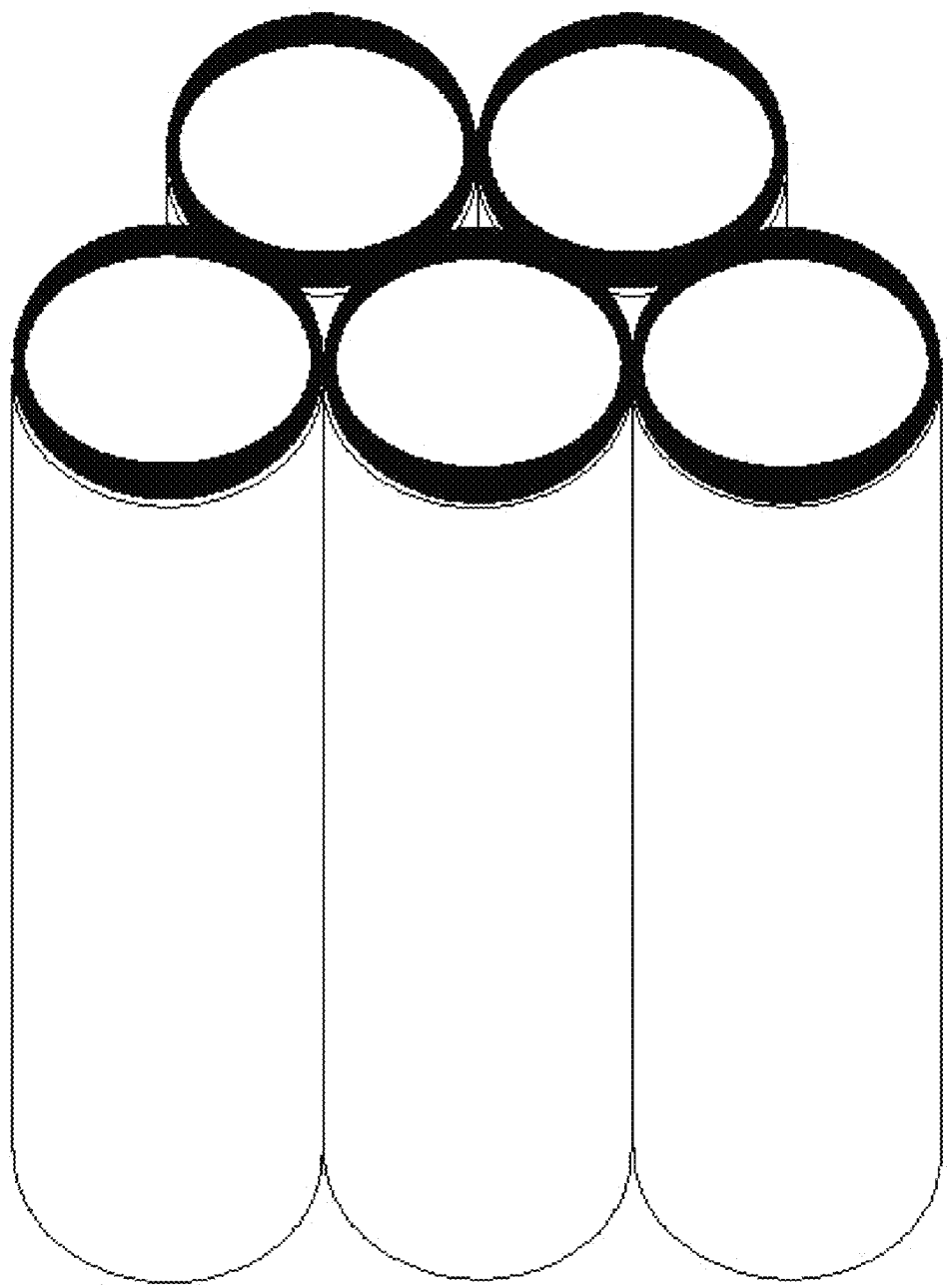
FIGS. 5, 6 and 7 illustrate subsequent, sequential stages in the formation of capped tubes of multiple compositions shown in FIG. 4.
Figure 6:
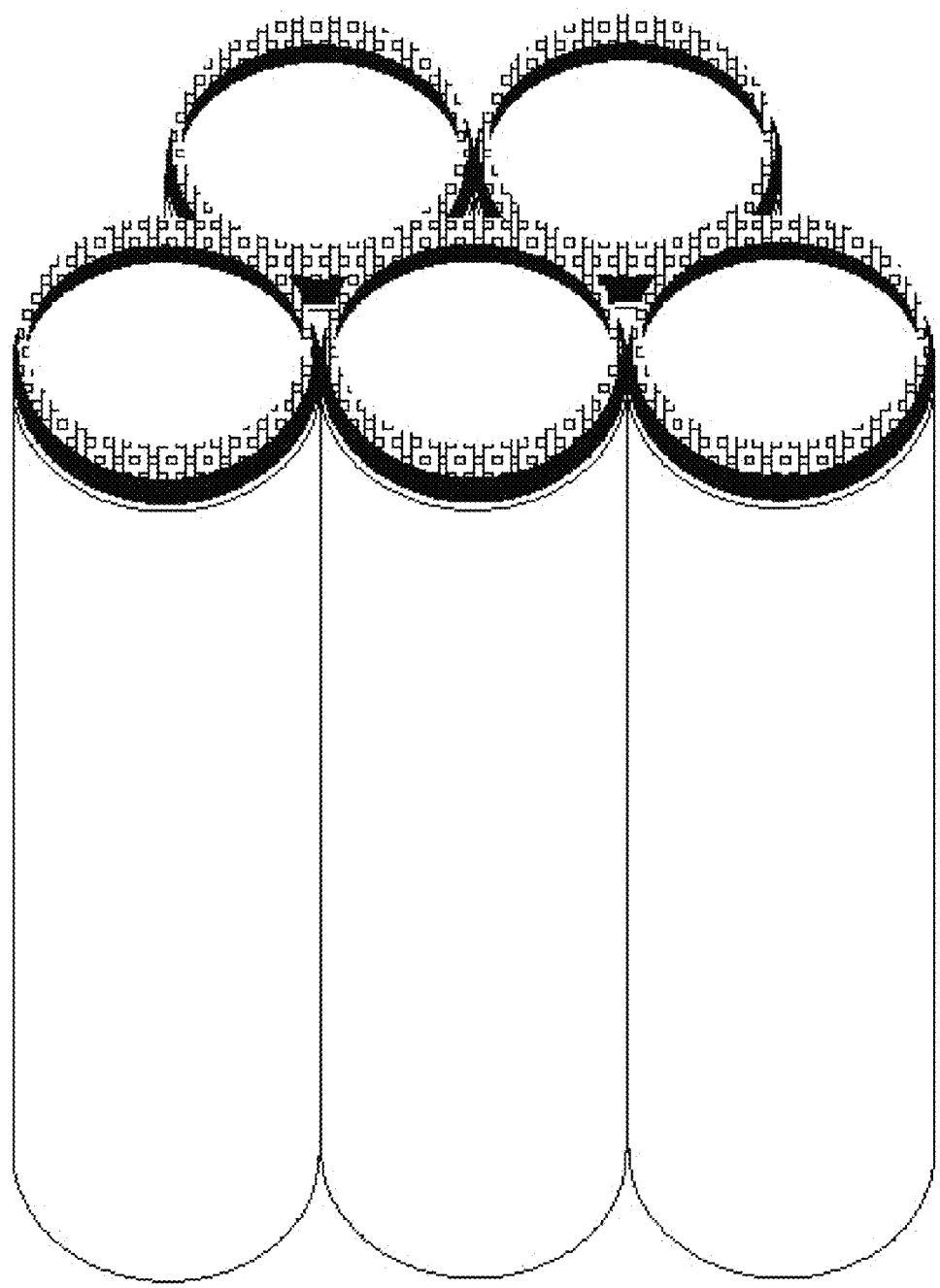
Figure 7:
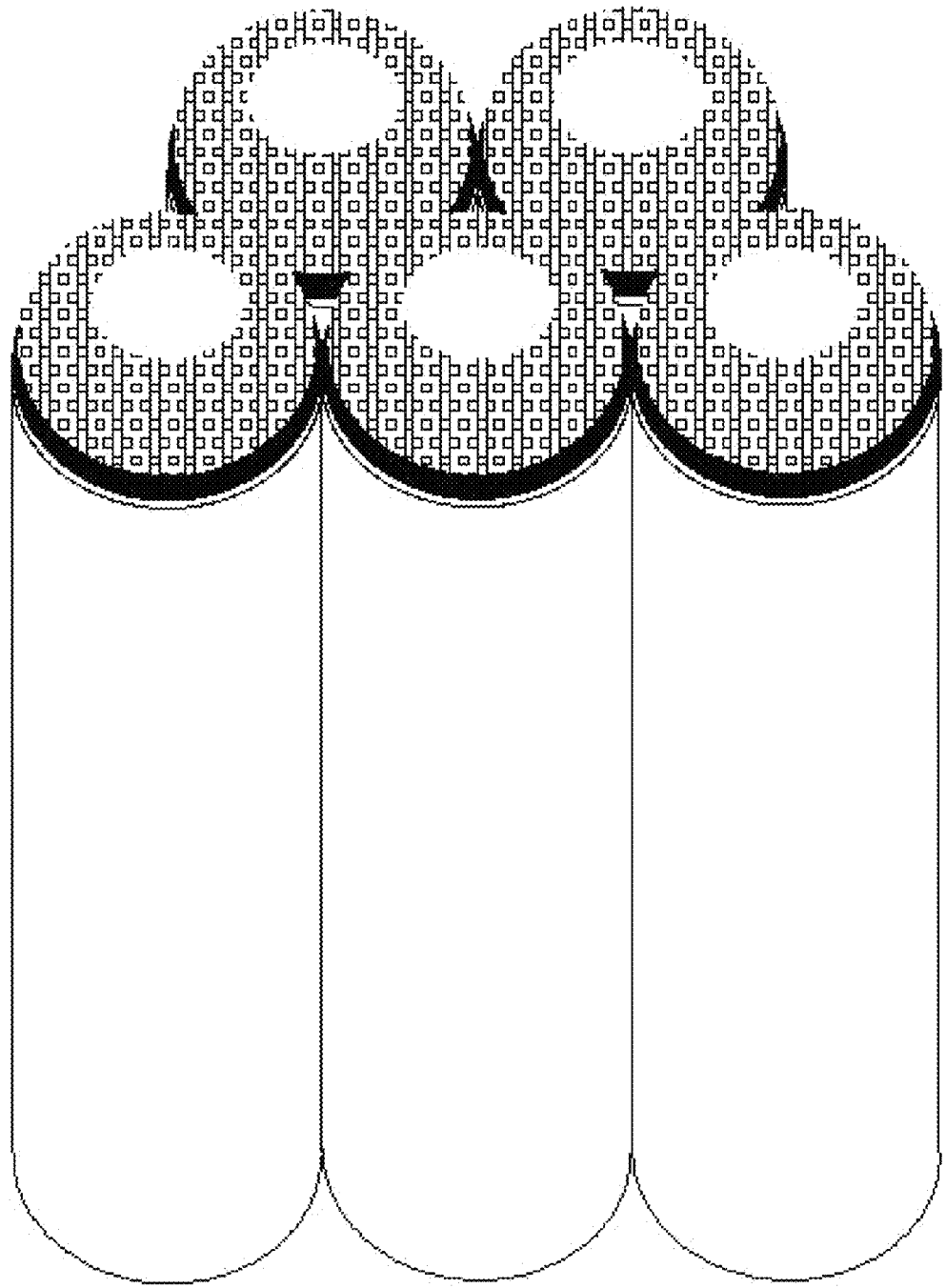

FIGS. 4, 5, 6 and 7 illustrate simplified diagrammatic views of the sequential fabrication of capped nanostructures by sputter deposition utilizing multiple compositions. FIG. 4 illustrates the pores of the substrate prior to application of any sputter deposition. FIG. 5 illustrates use of sputter deposition techniques to apply a metallic deposit onto the edges or open ends of the nanotube structures. FIGS. 5, 6 and 7 illustrate the sequential application of a metallic oxide onto the metal layer previously deposited on the nanotube structure. As will be observed, continued application of the metallic oxide results in the capping over of the tubes.

Photovoltaic Device

Figure 10:
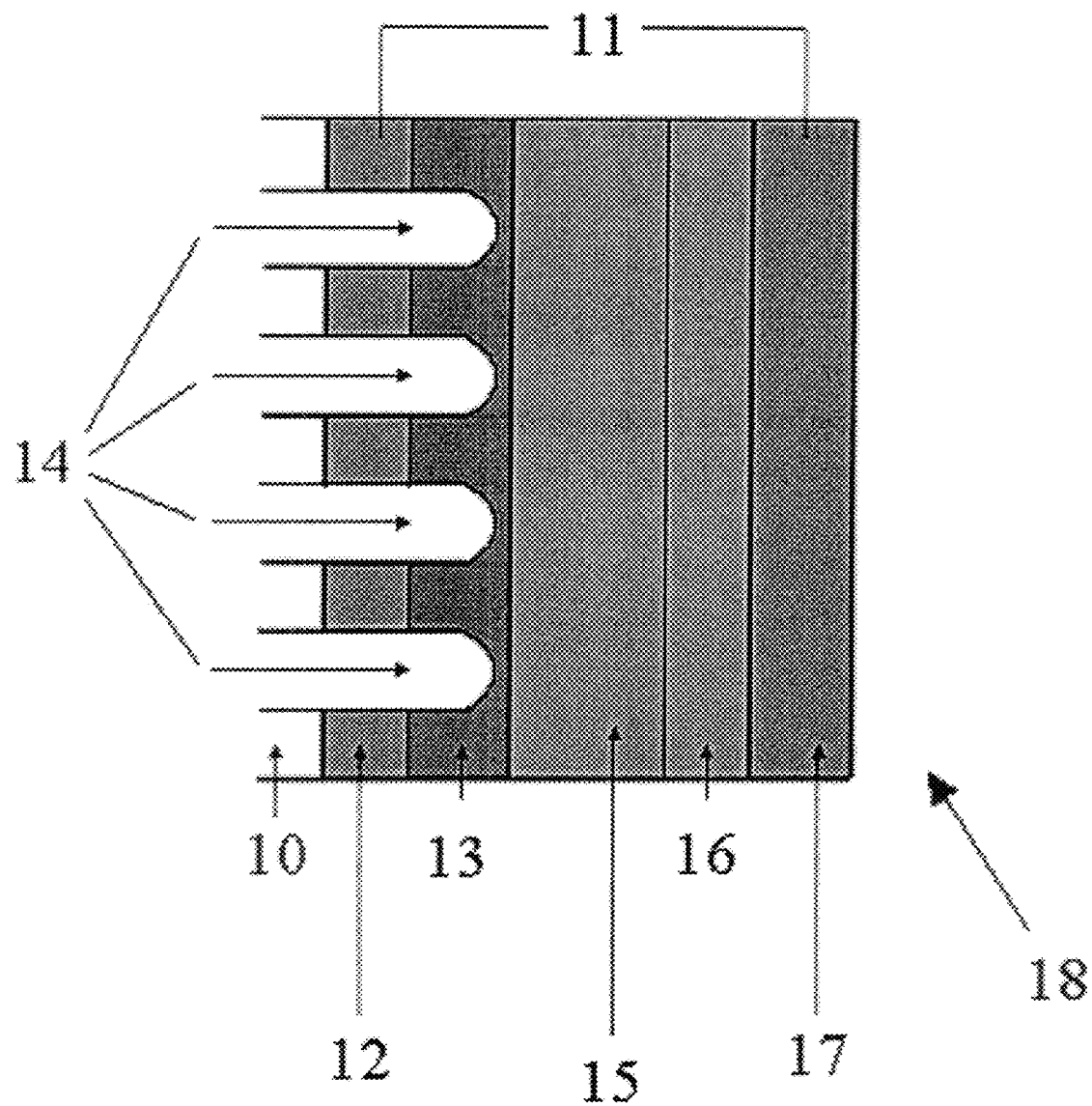
FIGS. 10 through 13 illustrate potential applications of the fabrication of nanobaskets by sputter deposition on porous substrates disclosed herein.

The second concept involves using these nanostructures to make photovoltaic devices 18 as shown in FIG. 10. In typical photovoltaic devices, a transparent current collector must be used so that light may pass through it for interaction with the photovoltaic material. Using the layered structure formation in concept (1), a new type of photovoltaic 18 could be manufactured. The photovoltaic 18 would be manufactured by first depositing 14 a conducting metal layer 12 on the nanoporous substrate 10. This layer will serve as a current collector 12. A second layer of a photoactive semiconductor (photovoltaic layer) 13 will be deposited and allowed to cap over. This structure is a very novel component for a photovoltaic device. It has been shown that nanoporous materials can serve as optical waveguides. (K. H. A. Lau, L.-S. Tan, K. Tanada, M. S. Sander, and W. Knoll, "Highly Sensitive Detection of Processes Occurring Inside Nanoporous Anodic Alumina Templates: A Waveguide Optical Study," *Journal of Physical Chemistry*, 108, 10812 (2004)). The size of the pores in the nanoporous substrate 10 can be of the appropriate size to interact with light such that they function as a waveguide. This will facilitate the passage of light 11 through to open pores of the noncoated side of the nanoporous substrate 10.

This light will be able to pass through the pores in the nanoporous current collector 12 impinging on the capped photovoltaic material 13. The size of the pore and the curvature of the cap part of the nanobaskets could further accentuate the interaction of light by acting both as an additional waveguide and a lens, further focusing the light on the photovoltaic material 13 and enhancing performance. This would be a novel structure for a photovoltaic device. The completed photocell 18 would be constructed by placing an electrolyte 15, complementary electrode 16, and a second current collector 17, respectively on the capped side of the photovoltaic material 13.

Battery Systems

Figure 11:
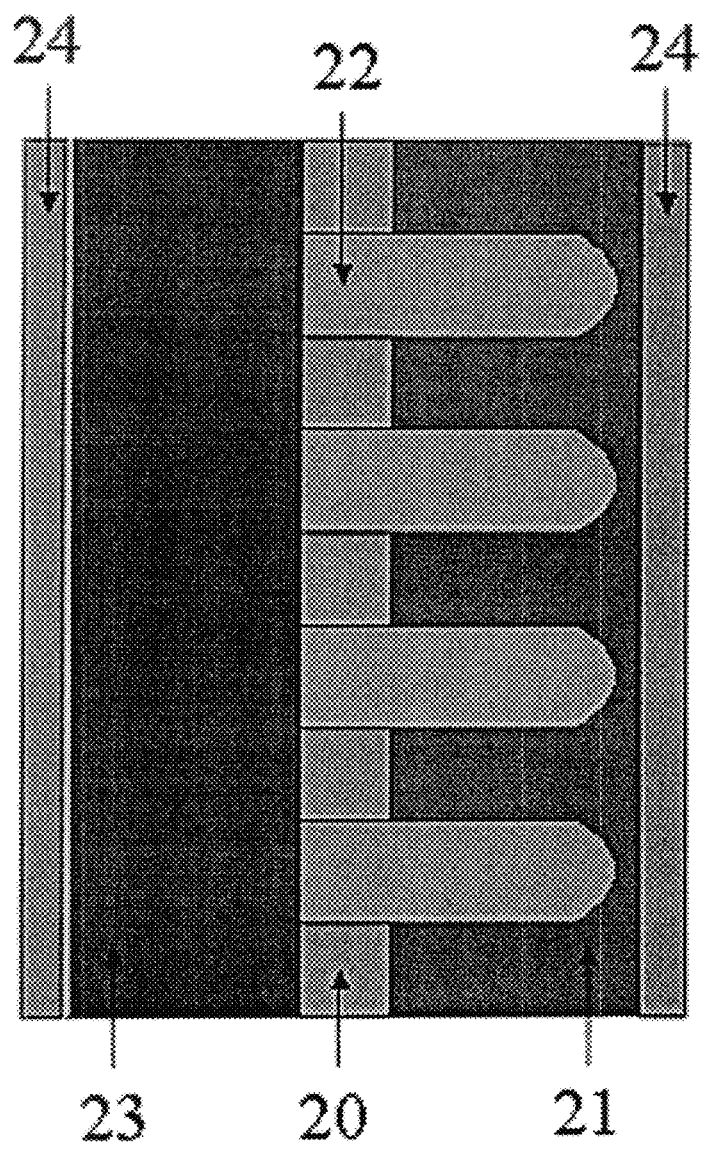

The third concept involves using a multilayered, nanobasket nanostructured material to make thin film battery systems as shown in FIG. 11. Again using the layered structure formation in concept (1), a layer of nanobaskets of an appropriate battery electrode material 21 are sputter-coated onto a nanoporous substrate 20. The nanoporous substrate 20 and the nanobaskets 21 are filled with electrolyte 22 using capillary action to "pull" the electrolyte into the pores (as described in Assignee's U.S. Pat. No. 6,586,133) or other techniques. The opposite side of the nanoporous substrate 20 would still have pores that are open, but filled with electrolyte 23. One configuration of the battery would now cover this end of the substrate with an appropriate electrode material forming a battery. Placing the electrode 23 on this side could be done by many methods including sputter-coating, spreading of pastes of composite electrode materials, etc. A current collector 24 would be affixed to this electrode 23. This thin film battery would have increased performance because of the increased surface area of the nanobasket electrode and because of the enhanced performance of electrolyte materials confined in nanoporous materials. (Seshumani Vorrey and Dale Teeters, "Study of the Ion Conduction of Polymer Electrolytes Confined in Micro and Nanopores," *Electrochimica Acta*, 48, 2137 (2003)).

Figure 12:
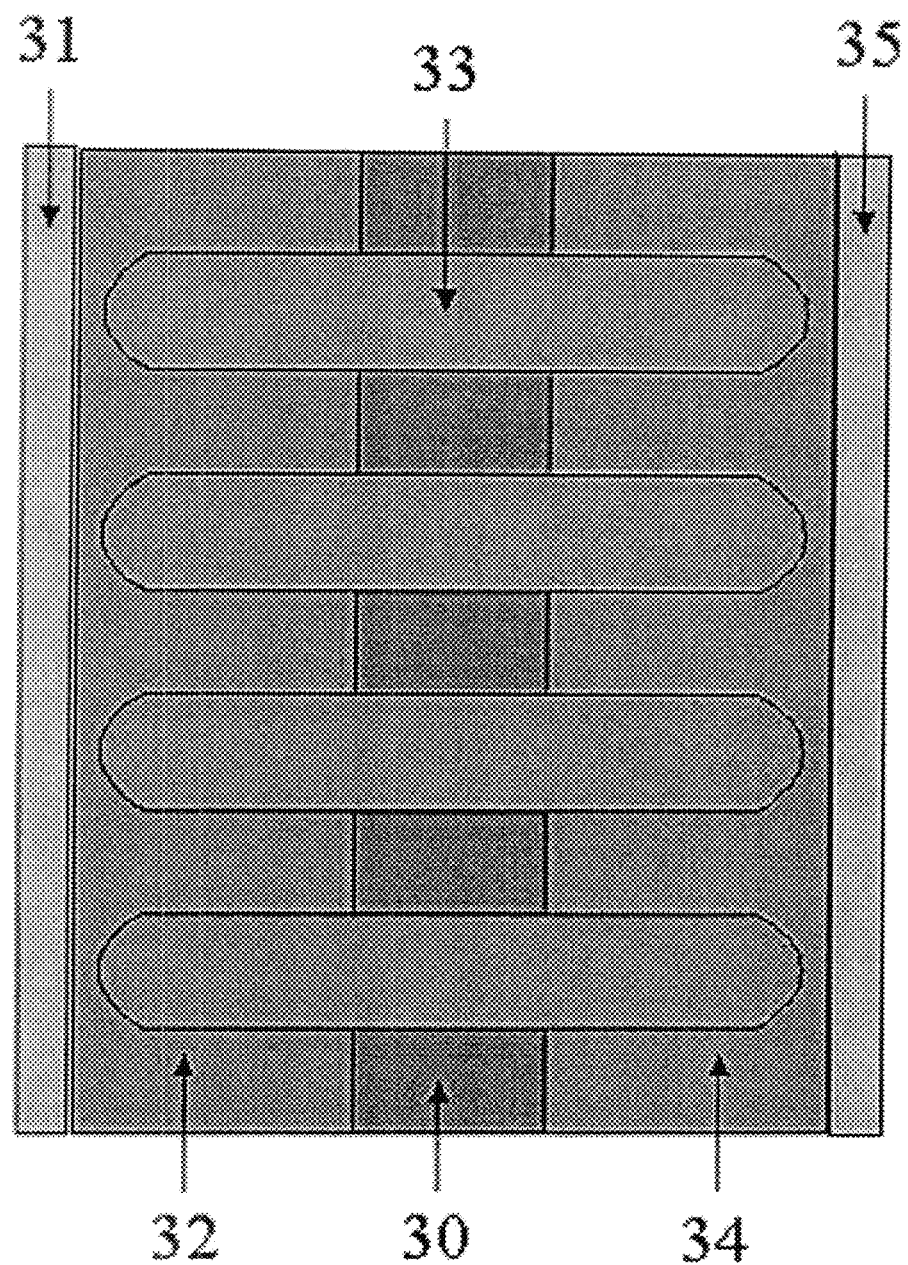

A second battery configuration as depicted in FIG. 12 would consist of first placing a layer of current collecting material 31, such as a metal, by sputter-coating on the nanoporous substrate 30. This current collecting layer 31 is capped with nanobaskets 33 of an appropriate battery electrode material. Using capillary action to "pull" the electrolyte into the pores (as described in Assignee's U.S. Pat. No. 6,586, 133) or another appropriate technique, both the pores of the substrate 30 and those in the current collector 31 and the nanobaskets 33 are filled with electrolyte 32. The opposite side of the nanoporous substrate would still have pores that are open, but filled with electrolyte 34. Deposition of the complementary electrode 35 would again be done by using sputter-coating. Because of the nanoporous substrate 33, a nanobasket electrode layer 34 would be formed. This configuration would benefit from having two electrodes 32 and 34 both having a nanobasket configuration. This thin film battery would have increased performance because of the increased surface area of both of the nanobasket electrodes 32 and 34 and because of the enhanced performance of electrolyte materials confined in nanoporous materials. (Seshumani Vorrey and Dale Teeters, "Study of the Ion Conduction of Polymer Electrolytes Confined in Micro and Nanopores," *Electrochimica Acta*, 48, 2137 (2003)).

Figure 13:
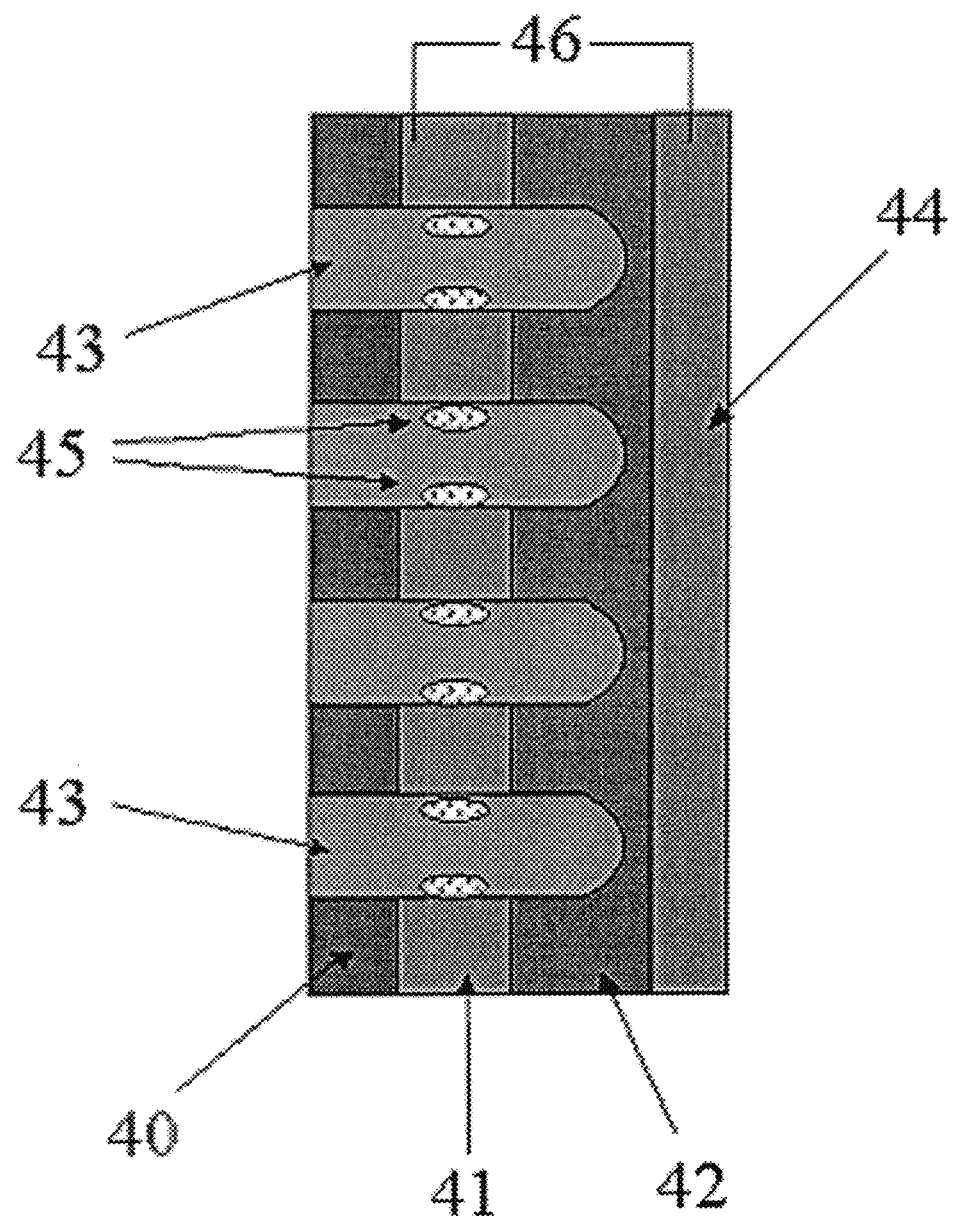

As shown in FIG. 13, another configuration would allow the in situ formation of a battery anode in a nanostructured thin film battery. This configuration consists of first depositing a first layer of current collecting material 41 by sputter-coating on a nanoporous substrate 40. This layer 41 is not allowed to cap. This current collecting layer 41 is then capped with nanobaskets 42 of an appropriate battery cathode material by deposition by sputter-coating. This material must contain metal ions of the same composition of the anode desired to be formed. By using capillary action to "pull" the electrolyte into the pores (as described in Assignee's U.S. Pat. No. 6,586,133) or other appropriate techniques, the pores of the substrate 40 and those in the current collector 41 and the nanobaskets 42 can be filled with electrolyte 43. A second current collector 44 would be placed on top of the nanobasket electrode layer 42. The opposite side of the nanoporous substrate would still have pores that are open, but filled with electrolyte 43. At this point a thin film battery could be formed by in situ deposition of an anode 45. The "in-situ" formation of an electrode has been described in the literature. (B. J. Neudecker, N. J. Dudney, and J. B. Bates, "Lithium-Free Thin-Film Battery with In Situ Plated Li Anode," *Journal of the Electrochemical Society*, 147 517 (2000)). This technique is applied to our nanostructured system by applying an appropriate current 46 to the two current collectors 41 and 44 drawing metal ions from the cathode layer 42 and through the electrolyte 43 present in the nanopores. This will result in electrochemical plating of the metal anode 45 onto the current collector 41 that closest to the nanobasket openings. This plated metal would be the anode 45 formed in situ. Since this anode 45 would be in very close proximity to the nanobasket 42, cathode material, it would enhance performance. Since the anode 45 is deposited in situ and is not exposed to air, the anode 45 is less likely to be degraded by air exposure, thus eliminating a major problem in the development of thin-film lithium batteries. Once again, this thin film battery would also have increased performance because of the increased surface area of the nanobasket electrode and because of the enhanced performance of electrolyte materials confined in nanoporous materials. (Seshumani Vorrey and Dale Teeters, "Study of the Ion Conduction of Polymer Electrolytes Confined in Micro and Nanopores," *Electrochimica Acta*, 48, 2137 (2003)).

Nanoscale Three-Dimensional Battery Architecture

One of the difficulties in creating effective three-dimensional architectures lies in the conflicting geometric goals for high capacity and low resistance. (W. Long Jeffrey, B. Dunn, R. Rolison Debra, S. White Henry, *Chem Rev*, 104 (2004) 4463-4492). When utilizing micro-rods or micro-plates of electrode material extending from a substrate into the electrolyte, for example, capacity increases as the length, L, of the rods or plates is increased but electronic resistance also increases with L, limiting overall system performance. In many three-dimensional architectures, a tradeoff between efficient ion diffusion and electron conduction must be made. The nanoscale three-dimensional battery architecture described herein addresses these concerns by combining a nanostructure that presents a high surface area for ion diffusion with nanoscale wiring to reduce ohmic resistance.

The individual wiring of nanobaskets has distinct benefits. Long et al. have used the dimensionless number, U, described in the equation below, to analyze electrode performance.

$$U = \left(\frac{w^2}{L^2}\right)\left(\frac{\mu}{\sigma}\right)\left(\frac{1}{C}\right) \quad \text{(Equation 1)}$$

where w is either the diameter of rods or the thickness of plates in a three-dimensional microelectrode architecture, L is the length of the rods or height of the plates, μ is the ionic mobility of the cations in the electrolyte, σ is the electronic conductivity of the electrode material and C is the volumetric energy capacity. U serves to describe the uniformity with which the electrode is utilized. The smaller U becomes the more uniform is the current distribution along the electrode.

A hollow structure, e.g., a nanobasket, is one of the best ways of overcoming these geometrical limitations, improving the utility coefficient (U) of the electrode by 50% based upon geometrical considerations alone. The nanoscale three-dimensional battery disclosed herein is the only system known to utilize a hollow (negative space) nanostructure. Further improvements are based upon the intimate contact between the nanowires and the nanobasket electrode, thereby providing a high effective σ value. Additionally, the L term in Equation 1 is maximized by the exterior surface of the nanobaskets, which would be the surface in contact with the electrolyte in a three-dimensional battery configuration. This exterior surface, which can be thought of as a topography of upside-down nanobasket 'caps,' presents a high surface area for electrolyte contact. FIG. 16(d) is an SEM image of this high surface area demonstrating its highly roughened nature, with fissures and crevices between the individual nanobaskets caps readily seen. Both the curved nanobasket caps and the fissures between them make a high surface area available for electrolyte contact, which will enhance ion diffusion into the electrode material and complement the augmented electronic conduction resulting from the nanowires inside the nanobaskets.

Nanobasket Electrodes

As fully described above in relation to fabrication of nanobaskets by sputter deposition on porous substrates, the nanostructured oxide films may be constructed by RF-magnetron sputtering onto a nanoporous anodized aluminum oxide (AAO) substrates. During sputtering, thickened columnar growths form around the pores of the substrate, essentially extending the pores with the oxide material. The diameter of these columns is dependent on the diameter of the substrate pores, and they grow thicker as they extend upward, eventually growing together to form caps over the empty pore spaces, i.e., "nanobaskets." (P. L. Johnson, D. Teeters, *Solid State Ionics*, 177 (2006) 2821-2825). Raman spectroscopy has revealed that the nanobaskets have a substructure of coalesced nanoparticles whose size is on the scale of 2 nm. It has been demonstrated that electrodes composed of such small nanoparticles show better cyclability (J. O. Besenhard, J. Yang, M. Winter, *J. Power Sources*, 68 (1997) 87-90; I. A. Courtney, J. R. Dahn, *J. Electrochem. Soc.*, 144 (1997) 2045-2052) and a greater initial specific battery capacity. (J. S. Sakamoto, C. K. Huang, S. Surampudi, M. Smart, J. Wolfenstine, *Mater. Lett.*, 33 (1998) 327-329).

Figure 16A:
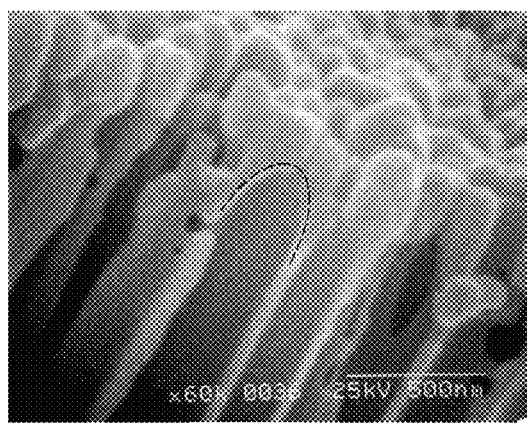
FIGS. 16(a) through 16(d) show SEM images of the nanowiring of a nanobasket structure in accordance with an illustrative embodiment of the nanoscale three-dimensional battery architecture disclosed herein.
Figure 16C:
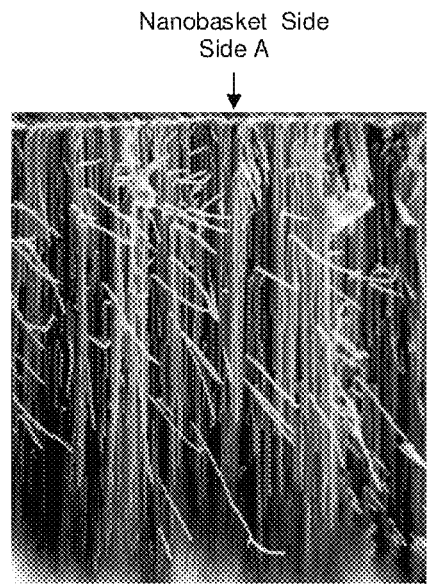
Figure 16B:
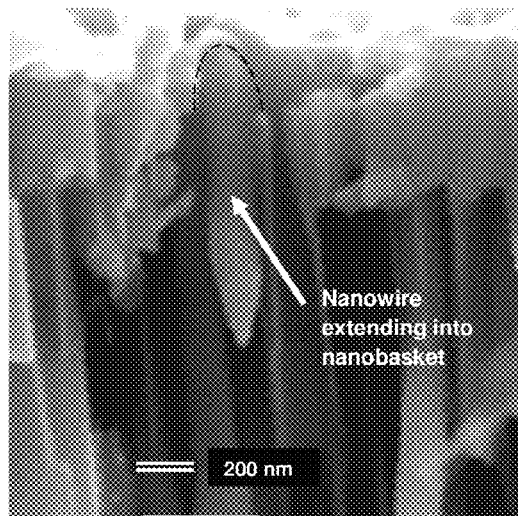
Figure 16D:
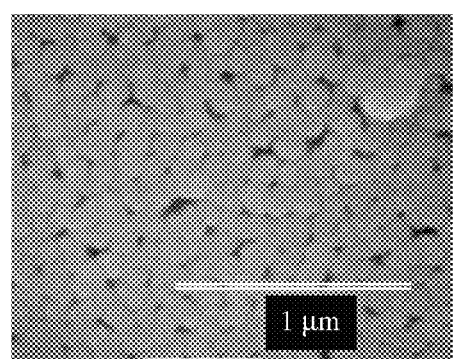

In preparation of the nanobattery, layers of electrode materials, and/or layered systems of a metal plus the electrode materials were sputter coated onto porous substrates, as shown in FIGS. 16(a) and 16(c). A range of electrode materials, metals, and substrates can be used.

Nanowiring of Nanobasket Electrodes

Figure 17:
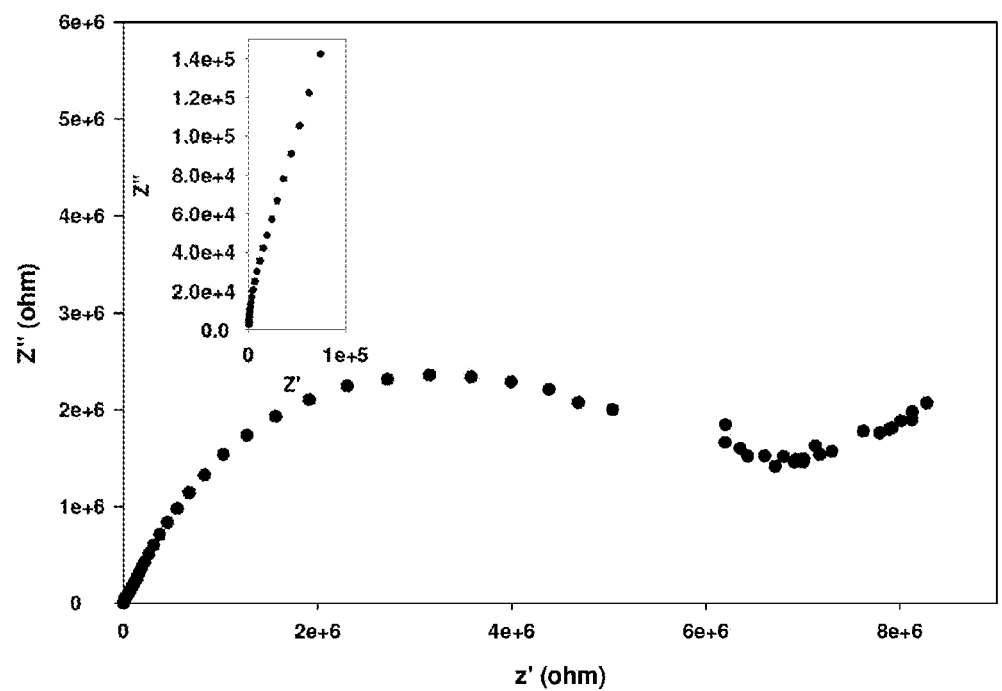
FIG. 17 illustrates a complex plane impedance plot or Nyquist plot of the nanobasket layer, obtained by contact through the nanowires, while the inset shows the high frequency region in increased detail.

The nanoscale three-dimensional battery architecture utilizes individually wiring the nanobaskets with copper wires to allow intimate electrical contact with the electrode material. Nanowired electrodes of both anodic and cathodic materials have been fabricated, and electrical contact with them has been demonstrated by AC Impedance spectroscopy, as illustrated in FIG. 17.

A standard, three-probe electrochemical cell was used to grow the nanowires in porous substrates. AAO substrates which had been sputtered with 100 nm of gold and 500 nm of $SnO_2$ or $LiCoO_2$ were placed onto a platinum dish so that the nanobaskets were in contact with the platinum dish, which served as the working electrode. The dish was filled with a thin layer of an aqueous solution 0.5 M in $CuSO_4$ and 0.1 M in boric acid, filling the pores of the substrate. The bare side of the substrate was brought into contact with another platinum surface, which acted as the counter electrode. A standard Calomel electrode functioned as the reference electrode. Copper nanowires were grown from the nanobasket electrode layers and into the 200 nm pores, ultimately extending through the entire 60 micron thickness of the AAO membrane, using a DC voltage of –0.15 V applied for 17 seconds from a potentiostat.

Nanowires may also be made by solution chemistry, by sol-gel processes, by electrophoretic deposition, electroless deposition, vapor-phase deposition, thermal evaporation, self-assembly, photoreduction, web coating and doctor blade techniques. The goal of prior published work however, was merely to grow wires alone. The application herein, of growing wires from an electrode structure and through the length of the membrane in order to make electrical contact, is unique and novel. As discussed above, copper nanowires were grown from the nanobasket electrode layers and into the 200 nm pores, ultimately extending through the entire 60 micron thickness of the AAO membrane, using a DC voltage of –0.15 V applied for 17 seconds in an aqueous solution 0.5 M in $CuSO_4$ and 0.1 M in boric acid. AAO membranes with 200 nm pore sizes, forming copper nanowires of the same diameter, were utilized since copper nanowires smaller than 100 nm diameter have a higher resistance due to being close to the mean free path of electron diffusion in copper metal. (W. Steinhogl, G. Schindler, G. Steinlesberger, M. Traving, M. Engelhardt, *J. Appl. Phys.*, 97 (2005) 023706/023701-023706/023707; K. Hinode, Y. Hanaoka, K.-I. Takeda, S. Kondo, *Jpn. J. Appl. Phys.*, Part 2 40 (2001) L1097-L1099). Enough wires were formed, however, to be clearly visible in the cleaved cross-section when examined in the scanning electron microscope, as can be seen in FIG. 16(c), and conclusive proof that the electrical contact could be made with through the wires to the electrode was provided by AC impedance spectroscopy. (FIG. 17). It will be appreciated that in addition to copper, any other conductive metal/material may be used as the nanowires, for example, an electrically conducting polymer, such as poly(acrylonitrile).

Thin-Film Electrolyte

Once both anodic and cathodic nanowired-nanoelectrodes have been fabricated, an electrolyte layer can be placed between the two electrodes. One configuration would be the thinnest layer of electrolyte possible; as long as the electrolyte forms a continuous layer covering the electrodes and is thick enough to prevent significant electronic conduction, which would "short" the battery. However, the thinner the electrolyte, the less distance the ion will have to traverse through the electrolyte. Thus, the shorter the distance, the less resistance the electrolyte will contribute to the battery, thereby making the battery function with less IR drop and enhance battery performance. Therefore, ion conduction is at its greatest with the thinnest layer of electrolyte possible, such as a thickness from below approximately one (1) nm to microns in thickness. During the charging and discharging of the battery, ions must move into out of the electrolyte and electrodes. Thus, an increased number of ions will readily be transferred during this process with an increased electrolyte surface area, and thereby enhancing ion conduction.

The electrode material could be a thin layer of liquid electrolyte or a thin layer of solid electrolyte. The liquid electrolyte could be aqueous or nonaqueous in nature. A solid electrolyte could include oxides, ceramics or polymer electrolytes. Electrode materials could also be multiple layers of solid and/or liquids or composite materials composed of various liquids and/or various solids or particles.

This thin layer could be placed on the electrodes by several methods, including but not limited to DC sputter coating, RF magnetron sputter coating, vapor deposition, spin coating and chemical self-assembly to form molecular level layers. Liquids and solutions could also be placed between the two electrode layers by placing micro- or nanoparticle insulation spacers between the two electrode structures and allowing capillary action to pull the liquids or solvents between the two electrodes. These spacers could be placed on one or both electrode surfaces, such as by dusting the surface with insulating micro- or nanoscale particles that would serve as the spacers, and then the two electrodes would be placed together. Dispersed insulating particles on the electrode surface would prevent the two electrodes from making direct contact and would leave a thin continuous void that the electrolyte could fill. Exposure of an edge of the two electrodes separated by the spacers to a liquid or solution would draw the liquid or solution into the thin void, thereby filling this space with electrolyte. The insulating spacer particles could be dispersed in the liquid or solution for placement. In this method, the solution or liquid could be placed on the electrode surface by solvent casting, spin coating or other techniques. The two electrodes would be placed together with the solvent and spacers already on one or both electrodes trapping the electrolyte between the two electrodes. Direct electrode contact would again be prevented by the spacers on the electrode surface. The liquid could be any aqueous or non-aqueous electrolyte. The solvent could contain a dissolved polymer and inorganic salts. With this solution, the solvent maybe evaporated leaving a polymer electrolyte between the two electrodes.

In whatever way the thin layer of electrolyte is placed/deposited between the two electrode surfaces to complete the battery system, the electrolyte will take advantage of the enhanced surface area of each electrode surface. The electrolyte will disperses itself into the fissures and crevices between the nanobasket structure, as shown in FIG. 16(d), and onto the roughened nanostructure of the top surface of the nanobaskets taking advantage of the enhanced electrode surface area.

Three-Dimensional Nanobattery

Figure 18:
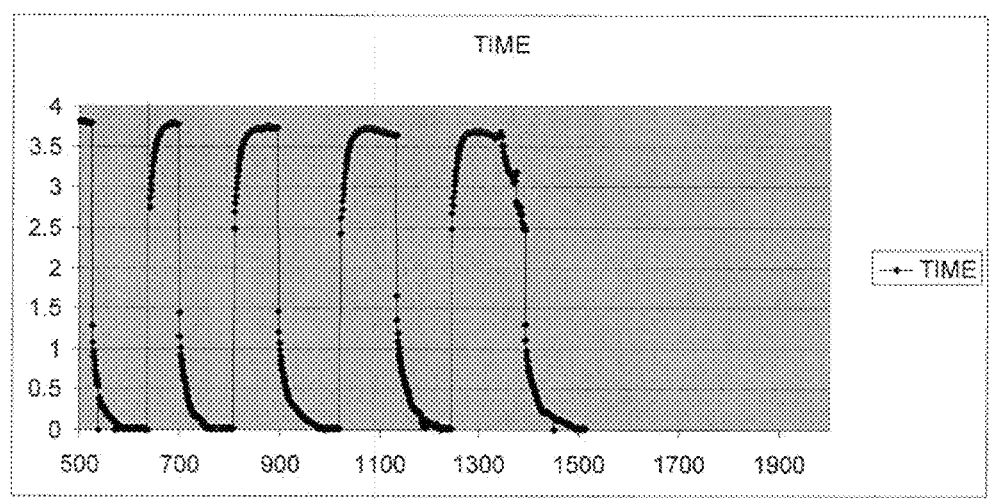
FIG. 18 is a graphical representation of the charge/discharge of the three-dimensional nanobattery at 50 nA charge rate and 10 nA discharge rate.

The combination of nanostructured electrodes (the nanobaskets), current collectors (the nanowires) and thin-film electrolyte create a truly three-dimensional nanostructured battery. Though theoretical configurations and ramifications of a three-dimensional nanobattery have been discussed in the literature (W. Long Jeffrey, B. Dunn, R. Rolison Debra, S. White Henry, *Chem Rev,* 104 (2004) 4463-4492), and other research efforts aimed at achieving it are under way, none of them have yet yielded a complete working battery. The nanoscale three-dimensional battery architecture disclosed herein, however, has been reduced to practice and a successful charge/discharge sequence has been conducted, as shown in FIG. 18.

Whereas, the devices and methods have been described in relation to the drawings and claims, it should be understood that other and further modifications, apart from those shown or suggested herein, may be made within the spirit and scope of this invention.

What is claimed is:

1. A method of producing a nanobattery, said method comprising the steps of:
   providing a substrate having a plurality of pores through said substrate, each of said pores having an edge at a surface of said substrate;
   depositing at least one material along said edge of said pores of said substrate to form a plurality of nanobaskets, each of said nanobaskets having an internal cavity;
   depositing at least one conductive material into said internal cavity of said nanobaskets and through said substrate to form a plurality of nanowires; and
   providing a layer of electrolyte in contact with said nanobaskets, wherein said layer of electrolyte is intermediate of and in contact with external surfaces of said nanobaskets.

2. The method of claim 1 further comprising the steps of:
   providing a cathode substrate having a plurality of pores, each of said pores having an edge at a surface of said cathode substrate;
   depositing said at least one material along said edge of each of said pores of said cathode substrate forming a plurality of cathode nanobaskets having internal cavities;
   depositing said at least one conductive material into said internal cavity of said cathode nanobaskets and through said pores of said cathode substrate to form a plurality of nanowires electrically connected to said cathode substrate;
   providing an anode substrate having a plurality of pores, each of said pores having an edge at a surface of said anode substrate;
   depositing said at least one material along said edge of each of said pores of said anode substrate forming a plurality of anode nanobaskets having internal cavities;
   depositing said at least one conductive material into said internal cavity of said anode nanobaskets and through said pores of said anode substrate to form a plurality of nanowires electrically connected to said anode substrate;
   providing said layer of electrolyte intermediate of said cathode nanobaskets and said anode nanobaskets; and
   making electrical contact between said plurality of nanowires electrically connected to said cathode substrate and said plurality of nanowires electrically connected to said anode substrate.

3. The method of claim 1 wherein said step of depositing said at least one material along said edge of said pores is accomplished by sputter-coating, chemical vapor deposition or pulsed laser method.

4. The method of claim 3 wherein said step of sputter-coating includes direct current sputter-coating, radio frequency sputter-coating, magnetron sputter-coating and reactive sputter-coating.

5. The method of claim 1 further comprising step of depositing at least one additional material to form a layered nanobasket structure.

6. The method of claim 1 wherein said substrate is at least one of solid oxide, polymeric, ceramic, mineral or metallic materials.

7. The method of claim 1 wherein said substrate is a polycarbonate, carbon, silica, silicon or alumina material.

8. The nanobattery of claim 1 wherein said material deposited is an oxide, polymeric, ceramic, mineral or metallic material.

9. The method of claim 8 wherein said material deposited is selected from the group consisting of tin oxide, lithium cobalt oxide, zinc oxide, copper oxide, titanium oxide, titanium dioxide, vanadium pentoxide, magnesium oxide, silicon dioxide, carbon, silicon, nichrome, and hydroxyapatite.

10. The method of claim 1 wherein said conductive material is copper or poly(acrylonitrile).

11. The method of claim 1 further comprising step of depositing at least one additional material to form a layered cap over said nanobasket.

12. The method of claim 1 wherein said internal cavity of said nanobaskets further comprises an axial channel having an open end and a capped end.

13. The method of claim 12 wherein said nanowires passes through said pores in said substrate, through said open end of said internal cavity, and into said channel of said internal cavity of said nanobaskets.

14. The method of claim 1 wherein said nanobaskets are capped nanobaskets each having said internal cavity.

15. The method of claim 1 wherein:
said substrate is a plurality of cathode substrates and a plurality of anode substrates;
said plurality of nanobaskets is a plurality of cathode nanobaskets and a plurality of anode nanobaskets;
said plurality of nanowires is a plurality of cathode nanowires and a plurality of anode nanowires;
said cathode nanowires are respectively fabricated into said internal cavities of said cathode nanobaskets and through said pores of said cathode substrates; and
said anode nanowires are respectively fabricated into said internal cavities of said anode nanobaskets.

16. The method of claim 15 wherein said layer of electrolyte is intermediate of an external surface of said cathode nanobaskets and an external surface of said anode nanobaskets.

17. The method of claim 1 wherein said plurality of nanowires further comprises a plurality of individually wired nanowires.

18. The method of claim 17 wherein each of said individually wired nanowires is in contact with a conductive contact plate.

19. A method of fabricating a three-dimensional nanobattery, said method comprising the steps of:
forming capped anode nanobaskets comprising axial anode channels;
forming anode nanowires within said anode channels of said anode nanobaskets;
forming capped cathode nanobaskets comprising axial cathode channels;
forming cathode nanowires within said cathode channels of said cathode nanobaskets; and
providing a layer of electrolyte intermediate of and in contact with an external surface of said anode nanobaskets and an external surface of said cathode nanobaskets.

20. The method of claim 19 further comprising forming said anode nanobaskets and/or said cathode nanobaskets by sputter-coating clusters of oxide, polymeric, ceramic, mineral and/or metallic materials.

21. The method of claim 20 wherein said step of sputter-coating includes direct current sputter-coating, radio frequency sputter-coating, magnetron sputter-coating and reactive sputter-coating.

22. The method of claim 20 wherein said materials are tin oxide, lithium cobalt oxide, zinc oxide, copper oxide, titanium oxide, titanium dioxide, vanadium pentoxide, magnesium oxide, silicon dioxide, carbon, silicon, nichrome and/or hydroxyapatite.

23. The method of claim 19 wherein said anode nanowires and/or said cathode nanowires are copper or poly(acrylonitrile).

24. The method of claim 19 further comprising electrically connecting said cathode nanowires to a cathode conductive contact plate and electrically connecting said anode nanowires to an anode conductive contact plate.

25. A method of fabricating a three-dimensional nanobattery, said method comprising the steps of:
forming a plurality of cathode nanobaskets on a cathode substrate having a plurality of pores, each of said cathode nanobaskets having an internal cavity;
forming a plurality of individually wired cathode nanowires in said internal cavity of said cathode nanobaskets and through said cathode substrate;
forming a plurality of anode nanobaskets on a anode substrate having a plurality of pores, each of said anode nanobaskets having an internal cavity;
forming a plurality of individually wired anode nanowires in said internal cavity of said anode nanobaskets and through said anode substrate;
providing a layer of electrolyte intermediate of said cathode nanobaskets and said anode nanobaskets; and
making electrical contact between said cathode nanowires electrically connected to said cathode substrate and said anode nanowires electrically connected to said anode substrate.

26. The method of claim 25 further comprising the steps of:
forming said cathode nanobaskets by depositing at least one material along an edge at a surface of each of said pores of said cathode substrate forming said cathode nanobaskets;
forming said cathode nanowires by depositing at least one conductive material into said internal cavity of said cathode nanobaskets and through said pores of said cathode substrate;
forming said anode nanobaskets by depositing said at least one material along an edge at a surface of each of said pores of said anode substrate; and
forming said anode nanowires by depositing at least one conductive material into said internal cavity of said anode nanobaskets and through said pores of said anode substrate.

27. The method of claim 26 wherein said step of depositing said at least one material along said edge of said pores of said cathode substrate and of said anode substrate is accomplished by sputter-coating, chemical vapor deposition or pulsed laser method.

28. The method of claim 27 wherein said step of sputter-coating includes direct current sputter-coating, radio frequency sputter-coating, magnetron sputter-coating and reactive sputter-coating.

29. The method of claim 25 further comprising the steps of forming layered cathode nanobaskets by depositing at least one additional material onto said cathode nanobaskets, and forming layered anode nanobaskets by depositing at least one additional material onto said anode nanobaskets.

30. The nanobattery of claim 25 wherein said material deposited is an oxide, polymeric, ceramic, mineral or metallic material.

31. The method of claim 30 wherein said material deposited is selected from the group consisting of tin oxide, lithium cobalt oxide, zinc oxide, copper oxide, titanium oxide, titanium dioxide, vanadium pentoxide, magnesium oxide, silicon dioxide, carbon, silicon, nichrome, and hydroxyapatite.

32. The method of claim 25 wherein said conductive material is copper or poly(acrylonitrile).

33. The method of claim 25 further comprising the steps of forming a capped cathode nanobasket by depositing at least one additional material over said cathode nanobasket, and forming a capped anode nanobasket by depositing at least one additional material over said anode nanobasket.

34. The method of claim 25 wherein said internal cavity of said cathode nanobaskets and said anode nanobaskets further comprises an axial channel having an open end and a capped end.

35. The method of claim 25 further comprising electrically connecting said cathode nanowires to a cathode conductive contact plate and electrically connecting said anode nanowires to an anode conductive contact plate.

* * * * *